US010192756B2

(12) United States Patent
Richter et al.

(10) Patent No.: US 10,192,756 B2
(45) Date of Patent: Jan. 29, 2019

(54) METHOD OF MACHINING A LEAD FRAME, AND LEAD FRAME

(71) Applicant: OSRAM Opto Semiconductors GmbH, Regensburg (DE)

(72) Inventors: Daniel Richter, Bad Abbach (DE); Brendan Holland, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/573,651

(22) PCT Filed: May 11, 2016

(86) PCT No.: PCT/EP2016/060569
§ 371 (c)(1),
(2) Date: Nov. 13, 2017

(87) PCT Pub. No.: WO2016/180883
PCT Pub. Date: Nov. 17, 2016

(65) Prior Publication Data
US 2018/0096861 A1    Apr. 5, 2018

(30) Foreign Application Priority Data
May 13, 2015   (DE) .................. 10 2015 107 515

(51) Int. Cl.
*H01L 21/48*    (2006.01)
*H01L 23/495*   (2006.01)
(Continued)

(52) U.S. Cl.
CPC ...... *H01L 21/4839* (2013.01); *H01L 21/4828* (2013.01); *H01L 23/49541* (2013.01);
(Continued)

(58) Field of Classification Search
CPC ............ H01L 21/4839; H01L 21/4828; H01L 23/49548; H01L 23/49575;
(Continued)

(56) References Cited

U.S. PATENT DOCUMENTS 8,933,481 B2 * 1/2015 Wang ...................... H01L 33/62
257/676
9,698,312 B2 * 7/2017 Wakaki ................. H01L 33/486
(Continued)

FOREIGN PATENT DOCUMENTS

DE   10 2008 024 704 A1   10/2009
DE   10 2010 021 791 A1   12/2011
(Continued)

OTHER PUBLICATIONS

Notice of Reasons for Rejection dated Nov. 6, 2018, of counterpart Japanese Application No. 2017-556179, in English.

*Primary Examiner* — Dao H Nguyen
(74) *Attorney, Agent, or Firm* — DLA Piper LLP (US)

(57) ABSTRACT

A method of processing a lead frame having at least one electrically conductive contact section includes forming a depression in the at least one electrically conductive contact section so that a first electrically conductive contact subsection and a second electrically conductive contact subsection are formed, which are delimited from one another by the depression, and forming a housing made of a housing material, which housing includes a housing frame that at least partially embeds the lead frame, formation of the housing including introduction of housing material into the depression so that a housing frame section formed by the housing material introduced into the depression is formed between the first and second electrically conductive contact
(Continued)

subsections to mechanically stabilize the first and second electrical conductive contact subsections by the housing frame section.

16 Claims, 22 Drawing Sheets

(51) Int. Cl.
    *H01L 23/498* (2006.01)
    *H01L 33/62* (2010.01)
    *H01L 33/48* (2010.01)
    *H01L 25/075* (2006.01)

(52) U.S. Cl.
    CPC .. *H01L 23/49548* (2013.01); *H01L 23/49575* (2013.01); *H01L 23/49861* (2013.01); *H01L 33/486* (2013.01); *H01L 33/62* (2013.01); *H01L 25/0753* (2013.01); *H01L 2224/27013* (2013.01); *H01L 2933/0033* (2013.01)

(58) Field of Classification Search
    CPC ......... H01L 23/49861; H01L 23/49541; H01L 33/62; H01L 33/486; H01L 25/0753
    USPC .............. 257/99, 98, 91, 670, 676, E21.502, 257/E23.043, E23.046, E23.124, E33.061, 257/E33.062, E33.072; 438/112, 113, 438/122, 123, 124, 15, 18, 26
    See application file for complete search history.

(56) References Cited

U.S. PATENT DOCUMENTS

| | | |
|---|---|---|
| 2011/0074000 A1 | 3/2011 | Jaeger et al. |
| 2011/0186875 A1 | 8/2011 | Egoshi et al. |
| 2012/0061808 A1 | 3/2012 | Liao |
| 2012/0132937 A1 | 5/2012 | Chan et al. |
| 2012/0138967 A1 | 6/2012 | Shimizu et al. |
| 2013/0092966 A1* | 4/2013 | Jaeger .................... H01L 33/60 257/98 |
| 2013/0154115 A1 | 6/2013 | Camacho et al. |
| 2013/0256733 A1* | 10/2013 | Lin ......................... H01L 33/62 257/99 |
| 2013/0343067 A1 | 12/2013 | Okada |
| 2014/0117388 A1 | 5/2014 | Kuo et al. |
| 2014/0299911 A1* | 10/2014 | Zitzlsperger ............ H01L 22/32 257/99 |
| 2014/0353710 A1 | 12/2014 | Zitzlsperger et al. |
| 2015/0001698 A1* | 1/2015 | Jaurigue ................. H01L 24/96 257/676 |
| 2016/0190410 A1 | 6/2016 | Kromotis et al. |
| 2017/0033271 A1 | 2/2017 | Gruendl et al. |

FOREIGN PATENT DOCUMENTS

| | | |
|---|---|---|
| DE | 10 2011 056 700 A1 | 6/2013 |
| DE | 10 2013 215 650 A1 | 3/2015 |
| DE | 10 2013 224 581 A1 | 6/2015 |
| EP | 0 213 764 A2 | 3/1987 |
| JP | S62-97359 A | 5/1987 |
| JP | 2012-216654 A | 11/2012 |
| JP | 2013-140892 A | 7/2013 |

* cited by examiner

METHOD OF MACHINING A LEAD FRAME, AND LEAD FRAME

TECHNICAL FIELD

This disclosure relates to a method of processing a lead frame, to a lead frame and to an optoelectronic lighting device.

BACKGROUND

DE 10 2013 215 650 A1 mentions in para. [0001] that it is known to configure optoelectronic components with optoelectronic semiconductor chips with housings, which have embedded lead frame sections made of copper. In such optoelectronic components, provision may be made to arrange the optoelectronic semiconductor chip on a lead frame section and embed it in an encapsulation material.

There is thus a need to provide an efficient concept that allows efficient processing of a lead frame, and an efficiently processed lead frame, and an efficiently produced optoelectronic lighting device.

SUMMARY

We provide a method of processing a lead frame having at least one electrically conductive contact section including forming a depression in the at least one electrically conductive contact section so that a first electrically conductive contact subsection and a second electrically conductive contact subsection are formed, which are delimited from one another by the depression, and forming a housing made of a housing material, which housing includes a housing frame that at least partially embeds the lead frame, formation of the housing including introduction of housing material into the depression so that a housing frame section formed by the housing material introduced into the depression is formed between the first and second electrically conductive contact subsections to mechanically stabilize the first and second electrical conductive contact subsections by the housing frame section.

We also provide a lead frame including at least one electrically conductive contact section, wherein a depression is formed in the at least one electrically conductive contact section so that a first electrically conductive contact subsection and a second electrically conductive contact subsection are formed, which are delimited from one another by the depression, the lead frame is at least partially embedded in a housing frame of a housing made of a housing material, the housing frame includes a housing frame section formed by a housing material between the first and second electrically conductive contact subsections introduced into the depression to mechanically stabilize the first and second electrical conductive contact subsections by the housing frame section.

We further provide an optoelectronic lighting device including an optoelectronic semiconductor component and the lead frame, wherein the semiconductor component is arranged on one of the first and second electrically conductive contact subsections, an electrically conductive connection being formed between the optoelectronic semiconductor component and the other of the first and second electrically conductive contact subsections.

Figure 1:
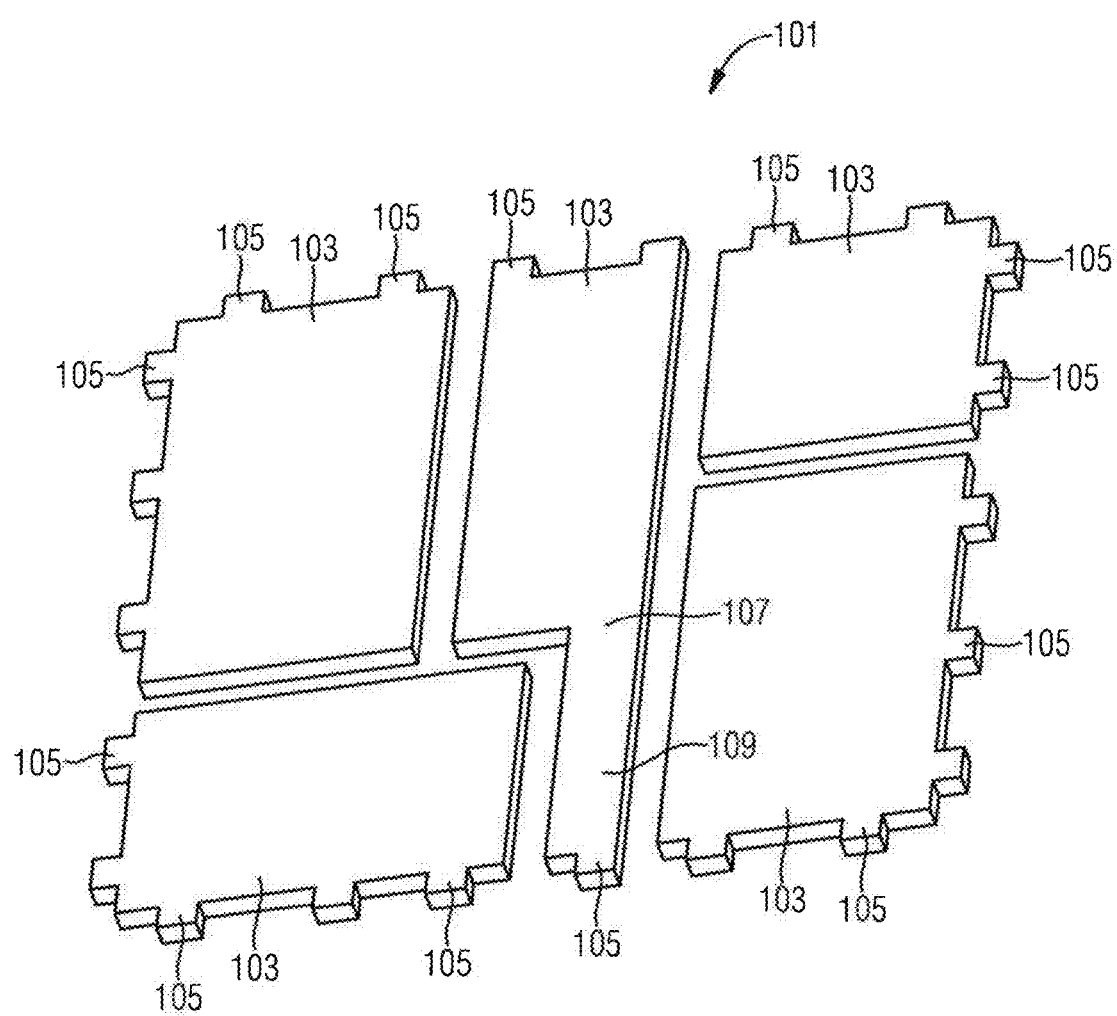
FIG. 1 shows a lead frame.

LIST OF REFERENCES 101 lead frame
103 solder pad
105 anchoring element
107 solder pad
109 anchoring element
201 RGBW component
203 light-emitting diode chip
205 bonding wire
207 temperature sensor
209 housing
400 lead frame
401 electrically conductive contact section
403 anchoring element
405 upper side
407 stabilizing element
601 lower side
701 depression
703 first electrically conductive contact subsection
705 second electrically conductive contact subsection
1001 housing
1003 housing frame
1005 housing frame section
1501 depression no longer present
1601 optoelectronic semiconductor component
1603 bonding wire
1605 adhesive barrier section
1607 structuring
1701 optoelectronic lighting device
2001 cantilevered contact sections
2301 etching protection layer
2303 region to be etched
2401 photoresist
2501 formation of a depression
2503 formation of a housing
2505 separation

DETAILED DESCRIPTION

Our method of processing a lead frame having at least one electrically conductive contact section may comprise:

forming a depression in the at least one electrically conductive contact section so that a first electrically conductive contact subsection and a second electrically conductive contact subsection are formed, which are delimited from one another by the depression, forming a housing made of a housing material, which housing comprises a housing frame that at least partially embeds the lead frame, the formation of the housing comprising introduction of housing material into the depression so that a housing frame section formed by the housing material introduced into the depression is formed between the first and second electrically conductive contact subsections to mechanically stabilize the first and second electrical conductive contact subsections by the housing frame section.

Our lead frame may comprise:

at least one electrically conductive contact section, wherein a depression is formed in the at least one electrically conductive contact section, so that a first electrically conductive contact subsection and a second electrically conductive contact subsection are formed, which are delimited from one another by the depression, wherein the lead frame is at least partially embedded in a housing frame of a housing made of a housing material, wherein the housing frame comprises a housing frame section, which is formed by a housing material between the first and second electrically conductive contact subsections introduced into the depression to mechanically stabilize the first and second electrical conductive contact subsections by the housing frame section.

We also provide an optoelectronic lighting device, comprising an optoelectronic semiconductor component and the lead frame, wherein the semiconductor component is arranged on one of the first and second electrically conductive contact subsections, an electrically conductive connection being formed between the optoelectronic semiconductor component and the other of the first and second electrically conductive contact subsections.

We thus provide a procedure of processing a lead frame including forming a depression in the at least one electrically conductive contact section. In this way, in particular, the technical advantage is achieved that housing material can be introduced into this depression during formation of the housing frame. Advantageously, a housing frame section made of the housing material introduced can then thereby be formed. This advantageously leads to mechanical stabilization of the first and second electrically conductive contact subsections. Efficient processing of the lead frame is thus advantageously made possible thereby.

In particular, this advantageously makes it possible that a cantilevered first and/or a cantilevered second electrically conductive contact subsection can be produced. In this way, the technical advantage can furthermore be achieved that greater design freedom is made possible in the lead frame design. In particular, even complex lead frame designs can therefore be produced. In particular, electrically conductive contact (sub)sections no longer necessarily need to be anchored in a housing.

In particular, miniaturization is thereby advantageously made possible. This thus means, in particular, that the same functionality can be produced in a reduced space. This is advantageous particularly in so-called multichip packages.

In particular, the technical advantage is thereby achieved that a simplified solder pad design can be produced. The pads, i.e. the first and second electrical conductive contact subsections, can be optimally positioned. It is not necessary to take correct anchoring in the housing into consideration.

In particular, solder pad sizes which are more customer-friendly and more reliable, since they are adapted, are thereby produced.

A lead frame herein may also be referred to as a lead frame. A first electrically conductive contact subsection may, in particular, be referred to as a first electrically conductive lead frame section. Similarly, a second electrically conductive contact subsection may be referred to as a second electrically conductive lead frame section. A contact section (i.e. the electrically conductive contact section, the first electrically conductive contact subsection and the second electrically conductive contact subsection) may, in particular, be referred to as a solder pad.

The effect of the depression is thus, in particular, that the electrically conductive contact section is subdivided into a first electrically conductive contact subsection and a second electrically conductive contact subsection.

Formation of the depression does not yet lead to the first and second electrically conductive contact subsections being separated from one another. They still have a connection to one another via the depression. This thus means that the first electrically conductive contact subsection and the second electrically conductive contact subsection are still electrically connected to one another after formation of the depression. This is because the depression has, in particular, a bottom region formed by the material of the electrically conductive contact section.

The depression has, in particular, a bottom via which this electrically conductive connection is established.

Formation of the depression comprises, in particular, ablation of material of the lead frame. This thus means, in particular, that a recess is formed in the lead frame. This thus means, in particular, that the depression may also be referred to as a recess or as a material recess.

The depression extends, in particular, continuously from a first edge of the electrically conductive contact section to a further edge of the electrically conductive contact section. The further edge is, in particular, arranged opposite the first edge. The further edge meets, in particular, together with the first edge in a corner. The further edge is thus, in particular, formed to meet together with the first edge in a corner. An edge may also be referred to as a border.

Formation of the housing may comprise a molding process. This means that the housing is formed by a molding process. A molding process may also be referred to as a mold process.

The housing may, according to one example, be formed by an encapsulation process, in particular by an injection molding process. This thus means, in particular, that formation of the housing preferably comprises an encapsulation process, in particular an injection molding process.

The housing material comprises, for example, one or more of the following materials or is formed from one or more of the following materials: silicone(s), epoxide(s), polyphthalamide(s) (PPA), polycyclohexylenedimethylene terephthalate (PCT).

The lead frame may comprise an electrically conductive metal, for example, copper or is formed from an electrically conductive metal, for example, copper. In particular, therefore, the contact section is formed from an electrically conductive metal, for example, copper or comprises such a metal, in particular copper.

Formation of the housing frame section may comprise formation of an adhesive barrier section arranged outside the depression so that the housing frame section comprises an adhesive barrier section arranged outside the depression.

In this way, in particular, the technical advantage is achieved that an adhesive barrier can be produced efficiently. Conventionally, in subsequent process steps, an optoelectronic semiconductor component is arranged on the first electrically conductive contact subsection or the second electrically conductive contact subsection. This is done, in particular, by an adhesive. This thus means, in particular, that according to one example, the semiconductor component is adhesively bonded onto the first electrically conductive contact subsection or the second electrically conductive contact subsection by an adhesive. The adhesive barrier, i.e. the adhesive barrier section, advantageously prevents this applied adhesive from running or flowing into a region of the lead frame into which the adhesive is not meant to flow.

This thus means, in particular, that the adhesive barrier, i.e. the adhesive barrier section, acts as a dam. The housing frame section comprising the adhesive barrier section may, for example, have a mushroom shape in cross section. A mushroom shape has, in particular, an elongate section, here the housing frame section between the first and second contact subsections, i.e. the housing material introduced into the depression. The mushroom shape has, in particular, an arched section, i.e. the adhesive barrier section, following on from the elongate section.

In a plurality of electrically conductive contact sections, they may at least be partially connected by at least one mechanical stabilizing element that is at least partially embedded in the housing frame during formation of the housing.

In this way, in particular, the technical advantage is achieved that efficient mechanical stabilization of the plurality of electrically conductive contact sections can be obtained. The effect of the mechanical stabilizing element is, in particular, that two contact sections connect to one another by the element. For example, the at least one mechanical stabilizing element may already be formed during production of the lead frame. This thus means that the mechanical stabilizing element is formed integrally with the lead frame.

A plurality of mechanical stabilizing elements may be provided that connect a plurality of electrically conductive contact sections to one another.

A plurality of electrically conductive contact sections may be provided. The lead frame thus comprises, for example, a plurality of electrically conductive contact sections, for example, four or 6 contact sections. Comments made in connection with a lead frame comprising one electrical conductive contact section apply similarly for examples comprising a lead frame comprising a plurality of electrically conductive contact sections, and vice versa. This thus means, in particular, that in a plurality of contact sections, these are processed correspondingly in a similar way to examples comprising one contact section. This thus means, in particular, that a depression is formed in each of the electrically conductive contact sections so that a first electrically conductive contact subsection and a second electrically conductive contact subsection, which are delimited from one another by the respective depression, are respectively formed. Similarly, the step of forming the housing frame also applies for the plurality of contact sections.

The at least one mechanical stabilizing element may be removed after formation of the housing.

In this way, in particular, the technical advantage is achieved that the lead frame becomes lighter.

Removal may comprise etching.

In this way, in particular, the technical advantage is achieved that the mechanical stabilizing element can be removed efficiently.

One or more anchoring elements may be formed on an outer flank of the electrically conductive contact section. The anchoring element (the plural should always be construed, and vice versa) is, for example, a projection formed on the outer flank of the electrically conductive contact section. An outer flank of the electrically conductive contact section refers, in particular, to a flank of the electrically conductive contact section facing away from the lead frame.

For example, an anchoring element (or a plurality of anchoring elements) is formed on an outer flank of the first electrically conductive contact subsection. The anchoring element is, for example, a projection formed on the outer flank of the first electrically conductive contact subsection. An outer flank of the first electrically conductive contact subsection refers, in particular, to a flank of the first electrically conductive contact subsection facing away from the lead frame.

For example, an anchoring element (or a plurality of anchoring elements) is formed on an outer flank of the second electrically conductive contact subsection. The anchoring element is, for example, a projection formed on the outer flank of the second electrically conductive contact subsection. An outer flank of the second electrically conductive contact subsection refers, in particular, to a flank of the second electrically conductive contact subsection facing away from the lead frame.

The lead frame may have an electrically conductive first or, respectively, second contact subsection free from an anchoring element. This means, in particular, that flanks of the corresponding contact subsection are free from an anchoring element. The flanks of the corresponding contact subsection are, for example, free from projections.

The following step may be carried out: separation of the first and second electrically conductive contact subsections from one another so that the first and second electrically conductive contact subsections are electrically insulated from one another.

This, in particular, achieves the technical advantage that the first and second electrically conductive contact subsections can be electrically insulated from one another. In this way, the electro-optical semiconductor component can advantageously be electrically contacted via these two electrically conductive contact subsections so that the optoelectronic semiconductor component can be operated.

A plurality of first and second electrically conductive contact subsections may be formed, a plurality of the first and/or second electrically conductive contact subsections respectively having an anchoring element, others of the first and/or second electrically conductive contact subsections being free from an anchoring element.

The aforementioned anchoring element advantageously leads to efficient anchoring of the corresponding electrically conductive contact section, or the correspondingly first or second electrically conductive contact subsection, in a housing which is formed, for example, from an encapsulation compound, in particular an injection molding compound.

The anchoring elements may be encapsulated, in particular injection molding is carried out around them, during formation of a housing.

First and/or second electrically conductive contact subsections free from an anchoring element are preferably surrounded by first and/or second electrically conductive contact subsections having an anchoring element. The first and/or second electrically conductive contact subsections that are free from an anchoring element are, in particular, arranged inside the lead frame, while the first and/or second electrically conductive contact subsections having an anchoring element establish, for example, an edge of the lead frame.

Separation may comprise etching.

In this way, in particular, the technical advantage is achieved that the first and second electrically conductive contact subsections can be separated efficiently from one another.

Formation of the depression may comprise etching.

In this way, in particular, the technical advantage is achieved that the depression can be formed efficiently.

A region intended to remain free from etching may be provided with etching protection, for example, with an etching protection layer, for example, with a film or, for example, with a coating material.

In this way, in particular, the technical advantage is achieved that it is possible to prevent regions that are not intended to be etched from being etched.

The etching may comprise dry etching and/or wet etching.

In this way, in particular, the technical advantage is achieved that efficient etching can be carried out.

The dry etching may comprise chlorine etching and/or the wet etching may comprise etching by HCl and FeCl.

In this way, in particular, the technical advantage is achieved that particularly efficient dry or respectively wet etching is made possible.

The electrically conductive contact section may be partially coated with a metal before formation of the housing to form a metal coating, a region to be etched remaining free from the metal layer coating.

By provision of a metal coating, it is in particular possible to achieve the technical advantage that efficient electrical contacting of the semiconductor component, or other further electronic components, can be achieved.

Because the region to be etched remains free from the metal coating, the technical advantage is achieved in particular that selective etching can be carried out. Selective etching means, in particular, that only the region that does not have a metal coating, i.e. is free from the metal coating, is etched. The provision of different surfaces (surfaces with a metal coating and surfaces free from a metal coating) thus, in particular, has the advantage that selective etching is made possible.

The lead frame may be produced by our method. Examples relating to the lead frame derive similarly from corresponding examples of the method, and vice versa. This applies similarly for the optoelectronic lighting device. Device features (features of the lead frame or the optoelectronic lighting device) therefore derive similarly from corresponding method features (method of processing a lead frame) and vice versa.

An optoelectronic semiconductor component may be a light-emitting diode, also referred to as a light-emitting diode. A light-emitting diode is also referred to as a light-emitting diode (LED). The light-emitting diode is, for example, an organic or inorganic light-emitting diode.

The light-emitting diode may be a laser diode.

The semiconductor component may be configured as a semiconductor chip. This thus means, in particular, that the light-emitting diode is preferably configured as a light-emitting diode chip, in particular as a laser chip.

An optoelectronic semiconductor component may comprise a light-emitting face. This thus means, in particular, that light is emitted by the light-emitting face during operation of the semiconductor component. Instead of or in addition to light, electromagnetic radiation which does not lie in the visible range, for example, lies in the infrared or ultraviolet spectral range, may also be emitted.

The electrically conductive connection may be a bonding wire.

The first electrically conductive contact subsection may, for example, be referred to as a solder pad. The second electrically conductive contact subsection may, for example, be referred to as a solder pad.

Electrical contacting of the optoelectronic semiconductor component may be achieved or produced via the first and second electrically conductive contact subsections.

The lead frame may have a planar lower side after the removal of the at least one stabilizing element, or after separation of the first and second electrically conductive contact subsections from one another.

Formulation "respectively" comprises, in particular, the formulation "and/or".

The above-described properties, features and advantages, as well as the way in which they are achieved, will become more clearly and readily comprehensible in conjunction with the following description of the examples, which will be explained in more detail in connection with the drawings.

In what follows, the same references may be used for identical features. Furthermore, for the sake of clarity, not all references for the individual elements are indicated in all the drawings.

FIG. 1 shows a lead frame 101 comprising a plurality of solder pads 103. The solder pads 103 respectively have a plurality of anchoring elements 105 in the form of projections. The anchoring elements 105 are used to anchor the solder pads 103 in a housing (not represented). This thus means that the anchoring elements 105 anchor the solder pads 103 in the housing. Such a housing may, for example, be produced by an encapsulation process, in particular an injection molding process.

The solder pad with the reference 107 has an unfavorable aspect ratio, insofar as it is in this case a long, narrow solder pad. In this case, therefore, in addition to the two anchorings 105 on the upper side of the solder pad 107 in relation to the plane of the paper, an anchoring section 109 extending the solder pad 107 is also provided on the lower side of the solder pad 107 in relation to the plane of the paper so that an anchoring element 105 formed on the anchoring section 109 can anchor the solder pad 107 in the housing. Such an additional anchoring section 109 leads to an increased space requirement, which then ultimately leads to larger components.

Figure 2:
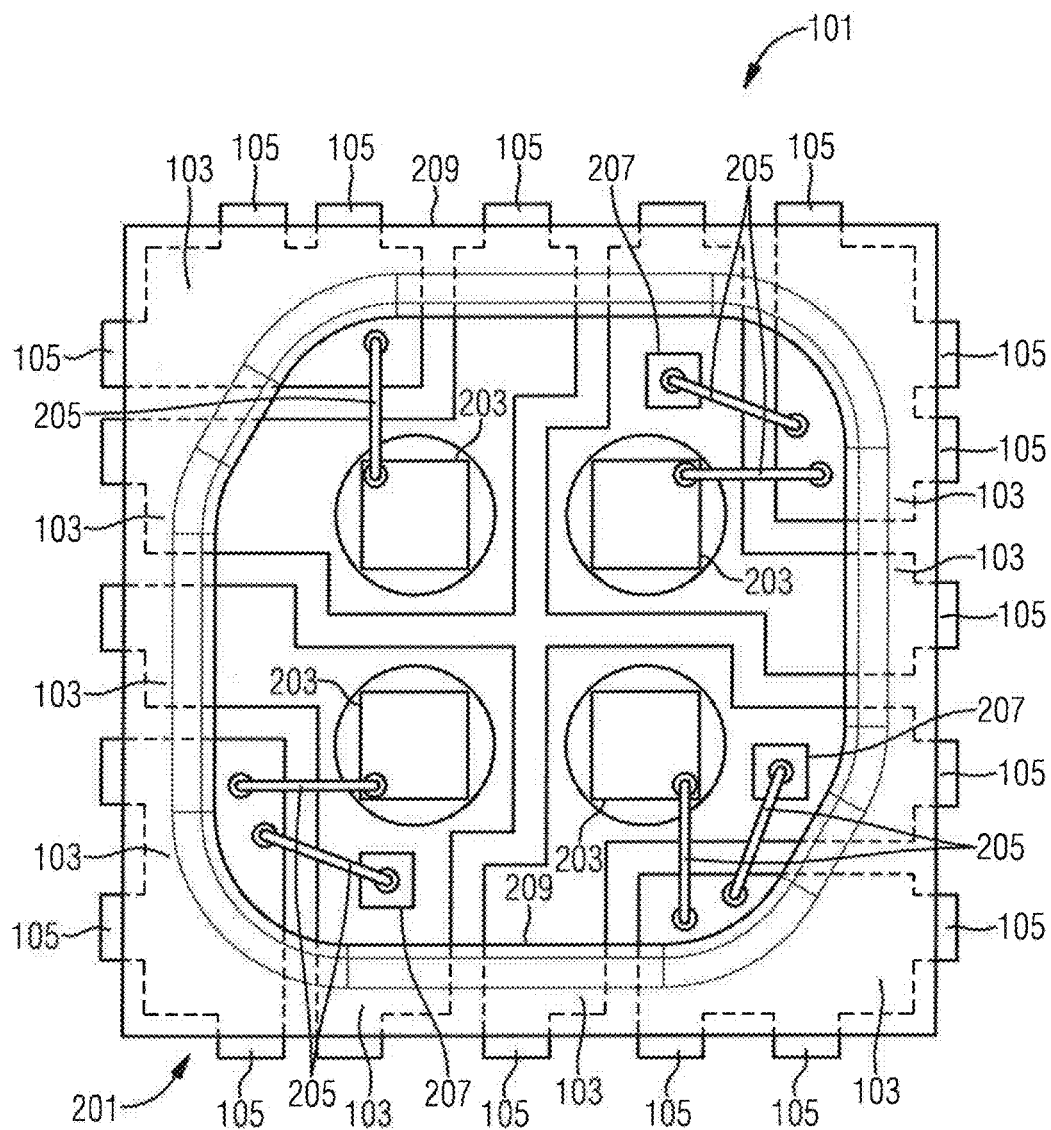
FIGS. 2 and 3 respectively show a lead frame in different views.
Figure 3:
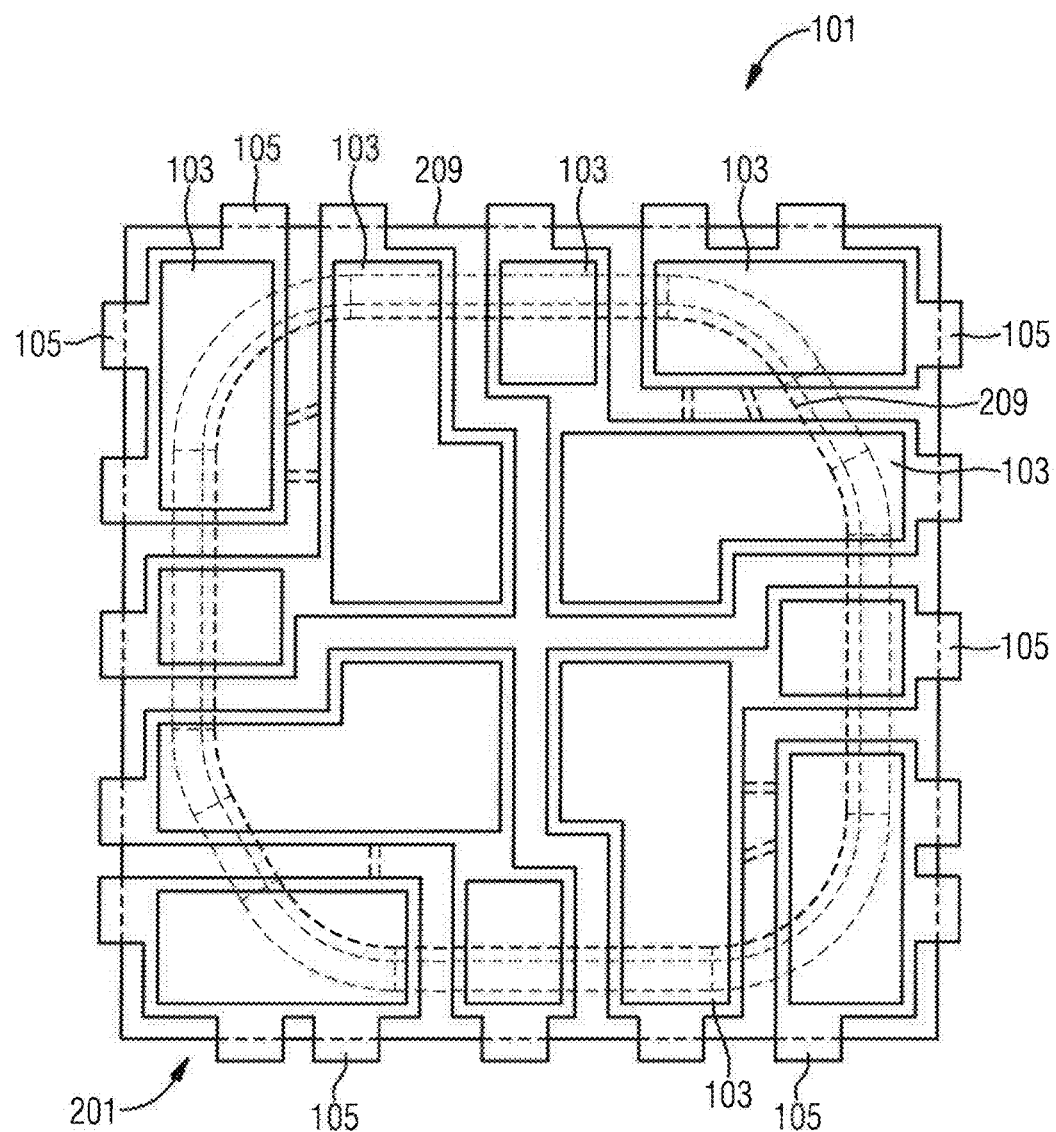

FIG. 2 shows an RGBW component 201 in a plan view from above. FIG. 3 shows the component 201 of FIG. 2 in a plan view from below. The letters "R, G, B, W" stand for "red, green, blue, white". This thus means that the component 201 can emit red light, green light, blue light, white light. This emission of different wavelengths is effected by a plurality of light-emitting diode chips 203 arranged on the solder pads 103. This thus means that four light-emitting diode chips 203 are respectively arranged on a solder pad 103. The solder pad 103 therefore acts as an electrode for electrical contacting of the corresponding light-emitting diode chip 203. A further solder pad 103 is then provided as a counter-electrode, which electrically connects to the light-emitting diode chip 203 by a bonding wire.

On a solder pad 103, for example, there may also be a temperature sensor 207, which may likewise be electrically contacted with a further solder pad 103 by a bonding wire 205.

The solder pads 103 are electrically insulated from one another. Depending on the electrical contacting, the solder pads 103 therefore form a cathode or an anode for the light-emitting diode chips 203, and respectively contact an anode or cathode of the light-emitting diode chips 203.

The lead frame 101 is embedded in a housing 209 which may, for example, be done by an encapsulation process.

As shown by the views of the component 201 as represented in FIGS. 2 and 3, each of the solder pads 103 per se must be anchored or embedded in the housing 209. This is done by the anchoring elements 105. Therefore, the anchoring elements 105 of the individual solder pads 103 must thus each be embedded individually in the housing 209. This leads to correspondingly large solder pads 103, even if the actual area required for the electrical contacting of the light-emitting diode chip 203 does not need to be that large.

The effect of this is that the component 201 cannot be miniaturized as desired. In particular, it leads to design restrictions.

Figure 4:
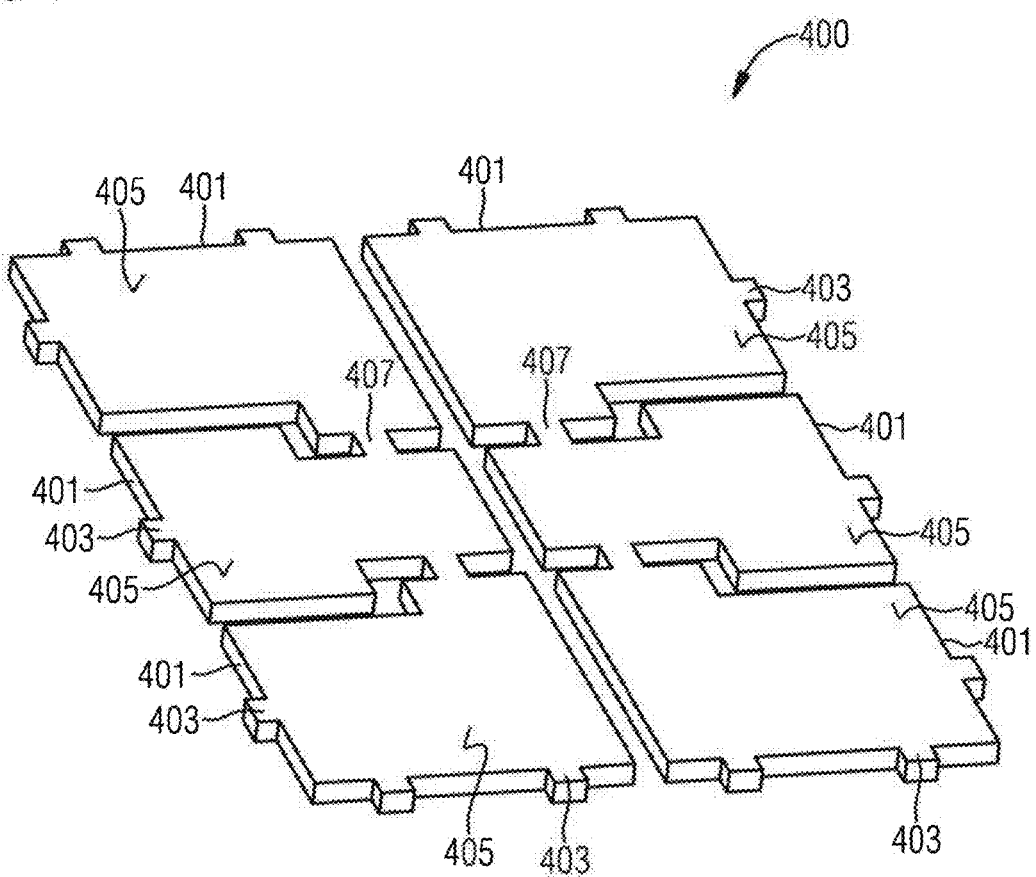
FIGS. 4-15 respectively show a lead frame in different views at different times in the method of processing a lead frame.
Figure 5:
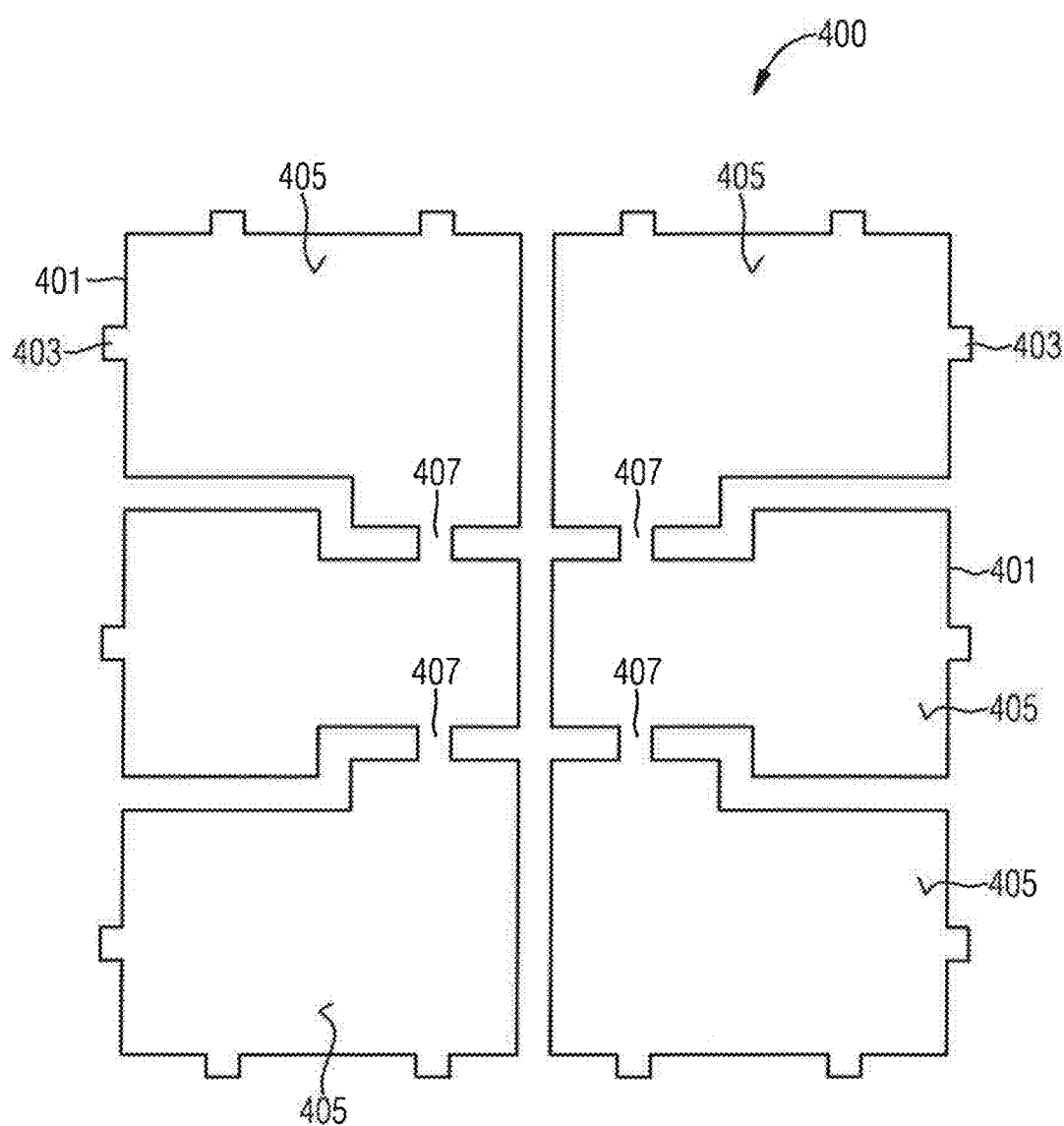
Figure 6:
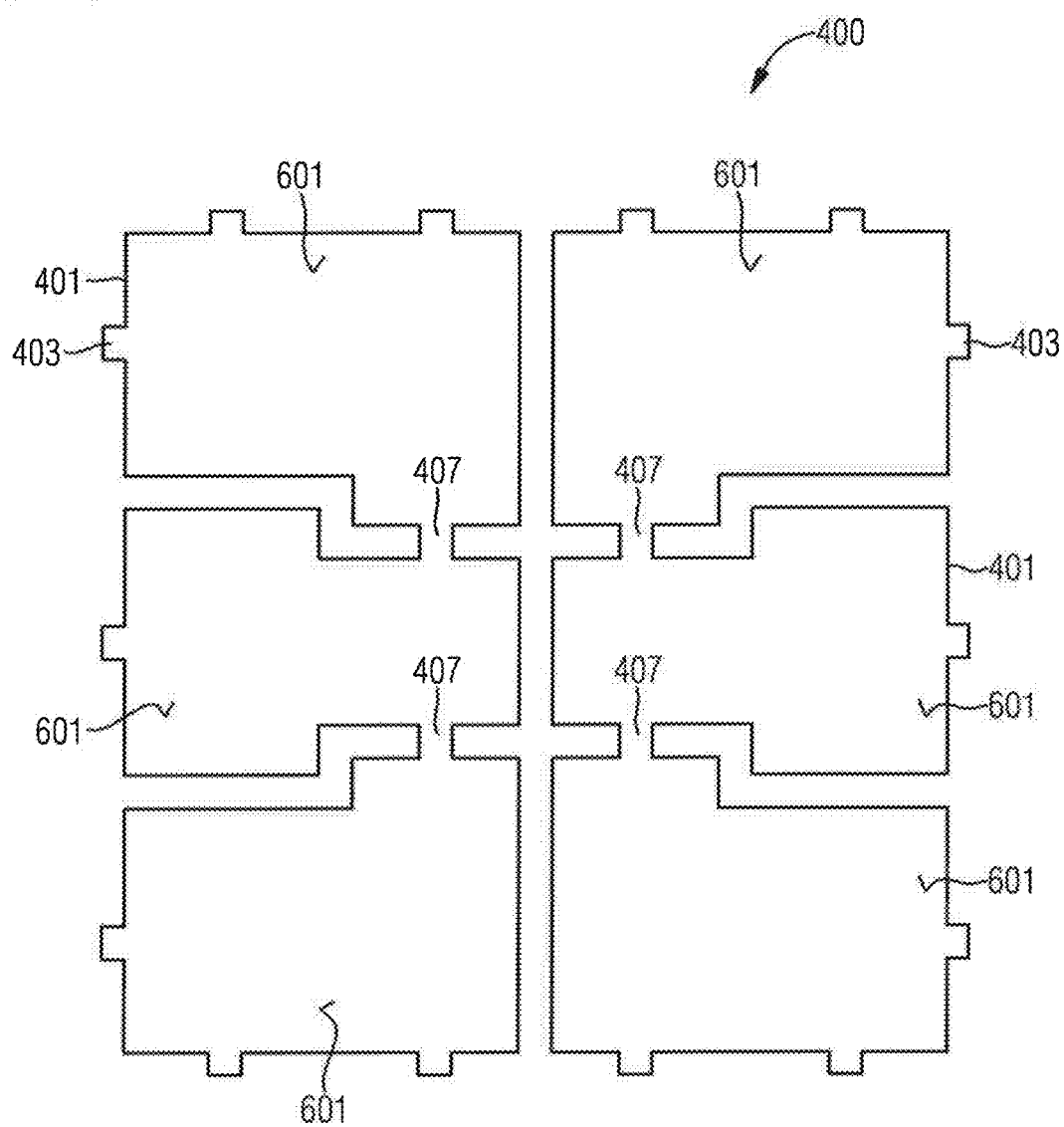

FIG. 4 shows a lead frame 400 in an oblique plan view of an upper side of the lead frame 400. FIG. 5 shows a plan view from above of the lead frame 400. FIG. 6 shows a plan view of the lower side of the lead frame 400.

The lead frame 400 comprises a plurality of electrically conductive contact sections 401, that may also be referred to as electrically conductive lead frame sections.

The contact sections 401 are, for example, formed from copper or comprise copper.

The lead frame 400 comprises six electrically conductive contact sections 401. In examples not shown, provision may be made for more or fewer than six electrically conductive contact sections 400 to be provided.

In a similar way to FIGS. 1 to 3, the electrically conductive contact sections 401 respectively have anchoring elements 403 that achieve anchoring of the electrically conductive contact sections 401 in a housing, which has not yet been produced.

The electrically conductive contact sections 401 respectively have an upper side 405 and a lower side 601 lying opposite the upper side 405.

Four stabilizing elements 407 are provided, two stabilizing elements in each case connecting three of the six contact sections 401 to one another. These stabilizing elements 407 achieve mechanical stabilization of the individual electrically conductive contact sections 401 between one another or against one another.

Figure 7:
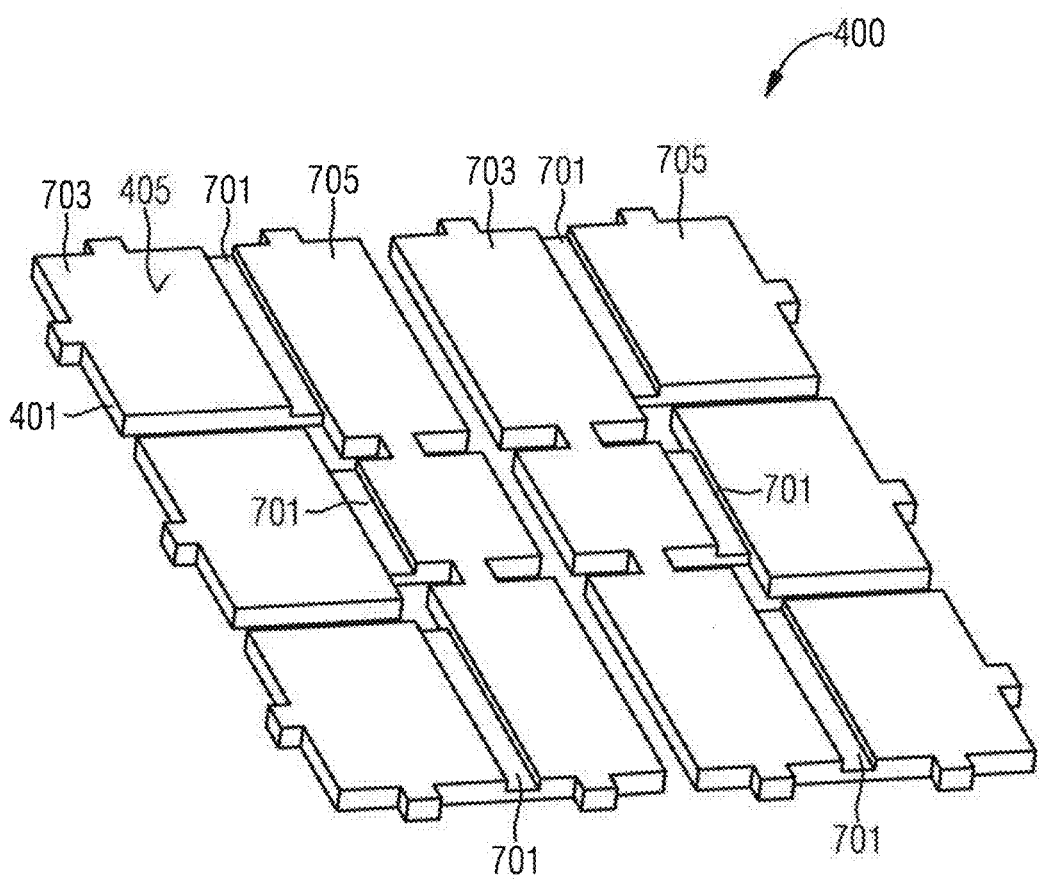
Figure 8:
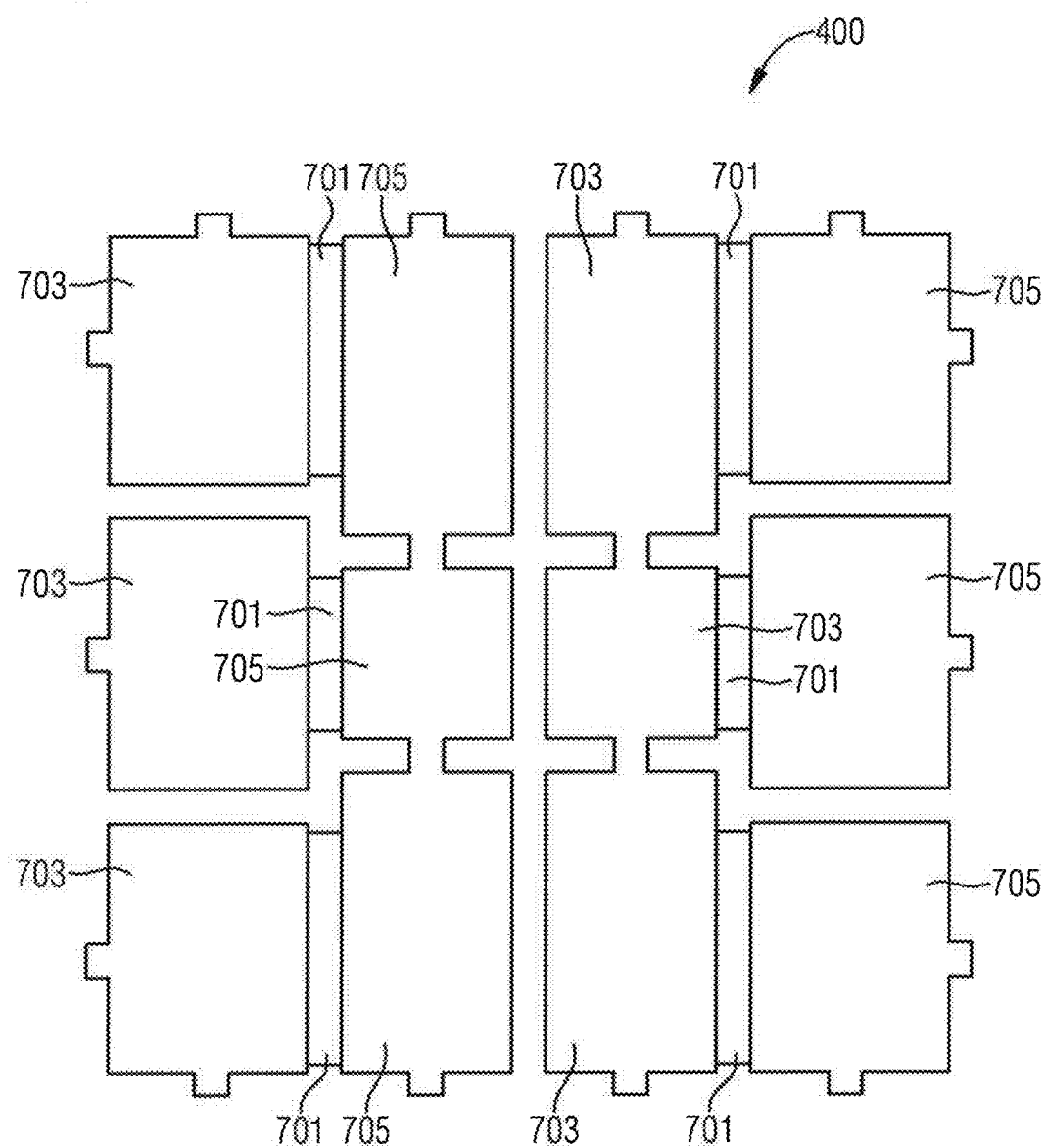
Figure 9:
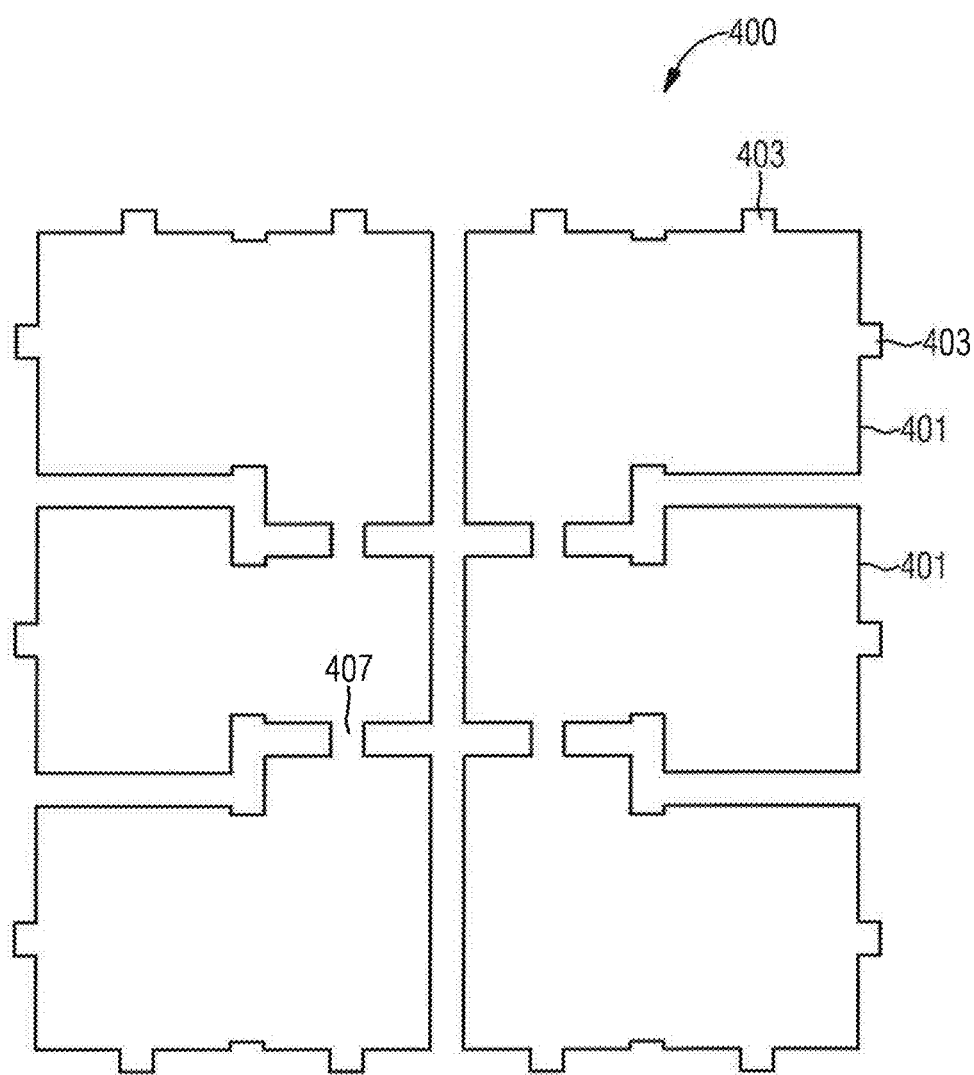

FIGS. 7 to 9 respectively show the lead frame 400 at a later time compared with FIGS. 4 to 6 in a method of processing a lead frame. In a similar way to FIG. 4, FIG. 7 shows an oblique plan view of the upper side 405. In a similar way to FIG. 5, FIG. 8 shows a plan view from above of the upper side 405. In a similar way to FIG. 6, FIG. 9 shows a plan view from below of the lower side 601.

Provision is made for a depression 701 to be formed respectively in the electrically conductive contact sections 401. Therefore, each of the electrically conductive contact sections 401 is thus subdivided into a first electrically conductive contact subsection 703 and a second electrically conductive contact subsection 705. A first electrically conductive contact subsection 703 and a second electrically conductive contact subsection 705 are thus formed, which are delimited from one another by the depression 701. Yet since the depression 701 is not an opening, but merely corresponds to a material recess, the two, first and second contact subsections 703, 705 still electrically connect to one another by corresponding material of the electrically conductive contact section 401. This thus means that material of the electrically conductive contact section 401 has been partially ablated or removed to form the depression 701. The two contact subsections 703, 705 thus still connect to one another by the depression 701.

For example, provision may be made for the depression 701 to be etched. For example, (also independently of this specific example) 50% of the thickness of the electrically conductive contact section 401 may be ablated in the region of the depression 701. How deeply material is ablated, or how much material is ablated in this case, is in particular a balance between a required stabilization of the lead frame 400 and the greatest possible amount of housing material between the contact subsections 703, 705.

After this structuring step, i.e. after formation of the depression 701, formation of a housing 1001 is provided. This is shown by way of example by FIGS. 10 to 12, the corresponding views of FIGS. 10 to 12 corresponding respectively to the views of FIGS. 7 to 9 or FIGS. 4 to 6.

FIG. 9 shows that the rear side 601 is not structured or processed in the step of forming the depression 701. The rear side 601 remains unstructured during formation of the depression 701.

The housing 1001 is formed from a housing material which may, for example, be an encapsulation compound, for example, silicone. This thus means that the housing 1001 may be formed by an encapsulation process, in particular an injection molding process or, for example, by dispensing or injection molding.

The housing 1001 has a housing frame 1003. The housing frame 1003 has a housing frame section 1005. This housing frame section 1005 is formed by introducing housing material into the depression 701 during formation of the housing 1001, for example, during an injection molding process. This thus means that the housing frame section 1005 is formed by the housing material introduced into the depression 701 between the first electrically conductive contact subsection 703 and the second electrically conductive contact subsection 705.

This housing frame section 1005 achieves mechanical stabilization of the first and second electrically conductive contact subsections 703, 705. Therefore, not every first and second electrically conductive contact subsection 703, 705 needs to have its own anchoring in an edge region of the housing 1001.

Figure 16:
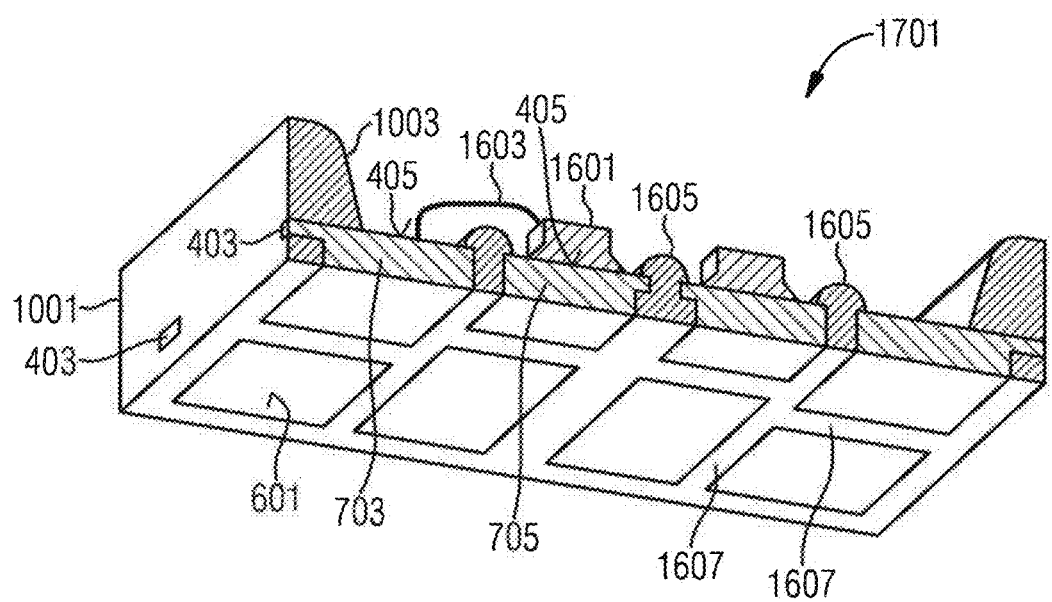
FIGS. 16-22 show the processed lead frame comprising a plurality of optoelectronic semiconductor components in different views.

Furthermore, provision is made for the housing frame section 1005 to be formed with an adhesive barrier section 1605, as can be seen in connection with FIG. 16. This adhesive barrier section 1605 is formed outside the depression 701 and has a parabolic or circular shape similar to a mushroom shape. The effect of the adhesive barrier section 1605 is that an adhesive applied onto the upper side 405 of the contact subsections 703, 705 does not run.

The mechanical stabilizing elements 407 are at least partially embedded in the housing frame section 1005.

Figure 10:
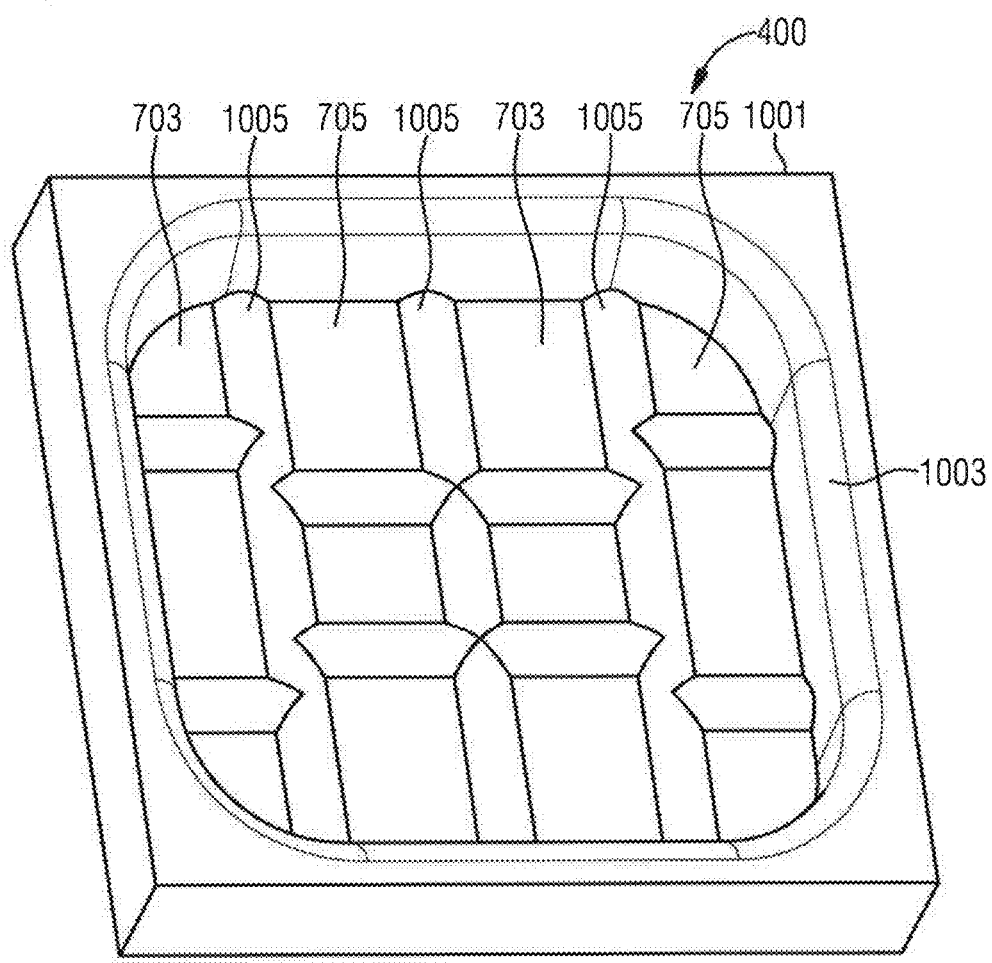
Figure 11:
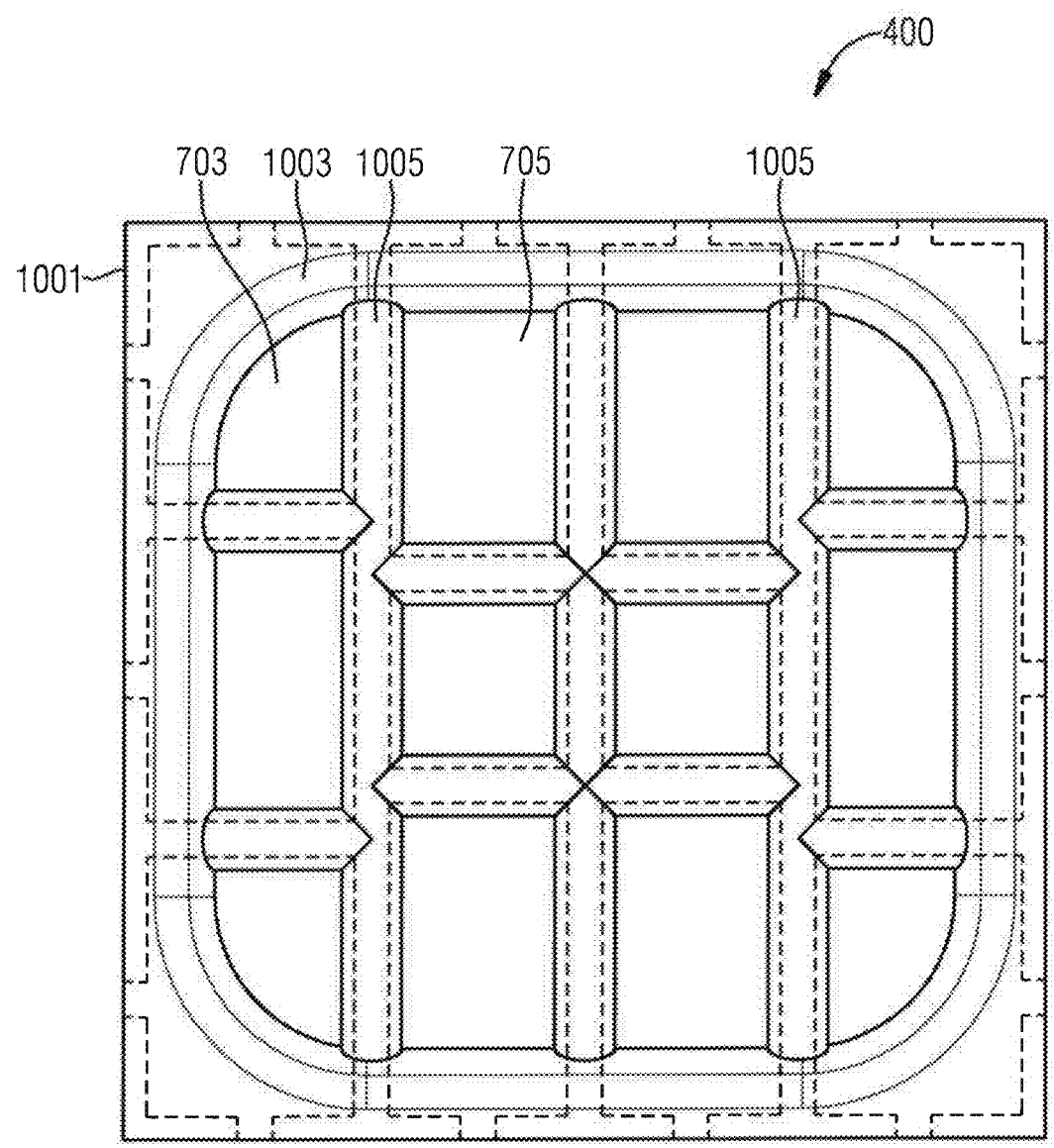
Figure 12:
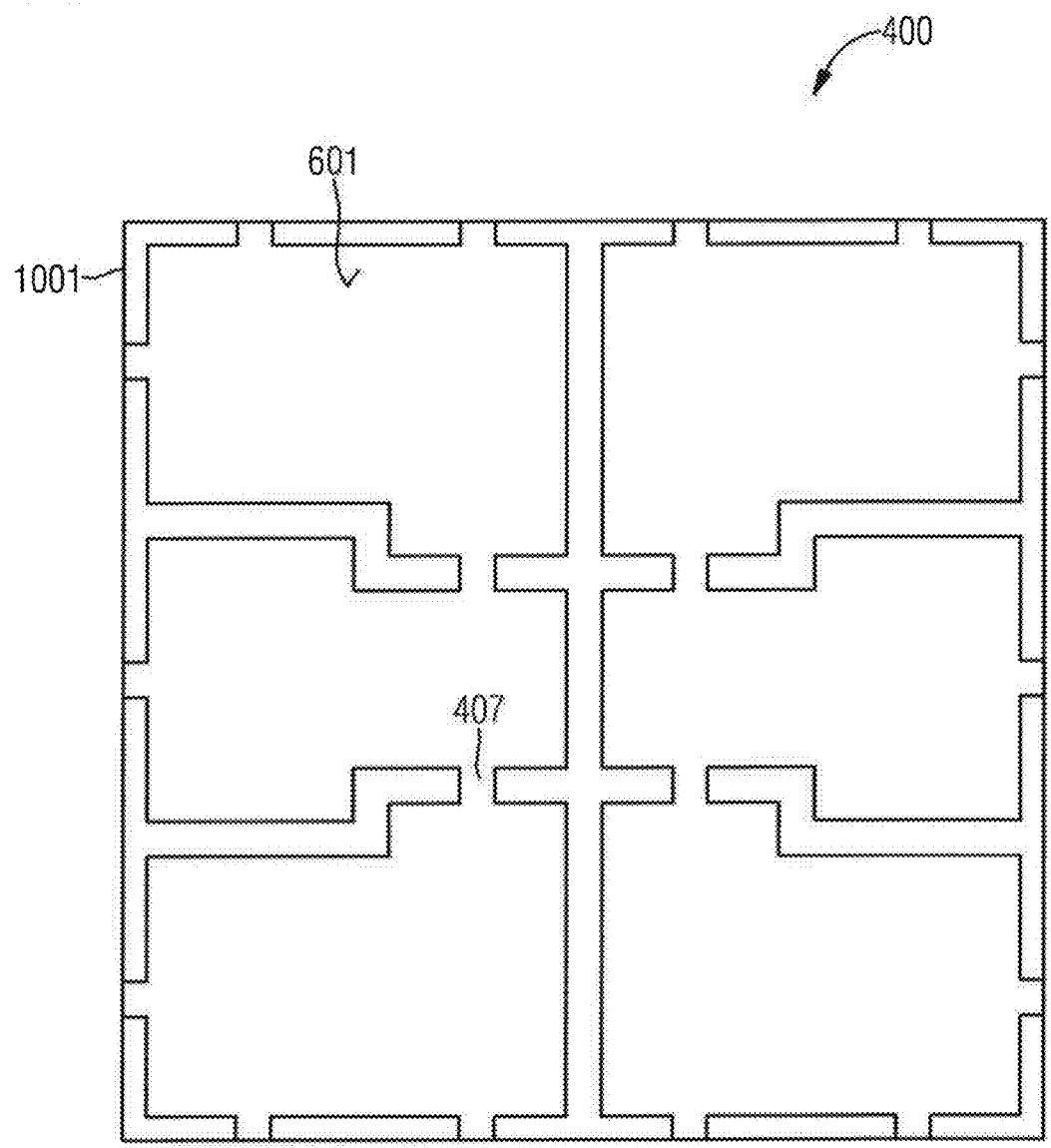
Figure 13:
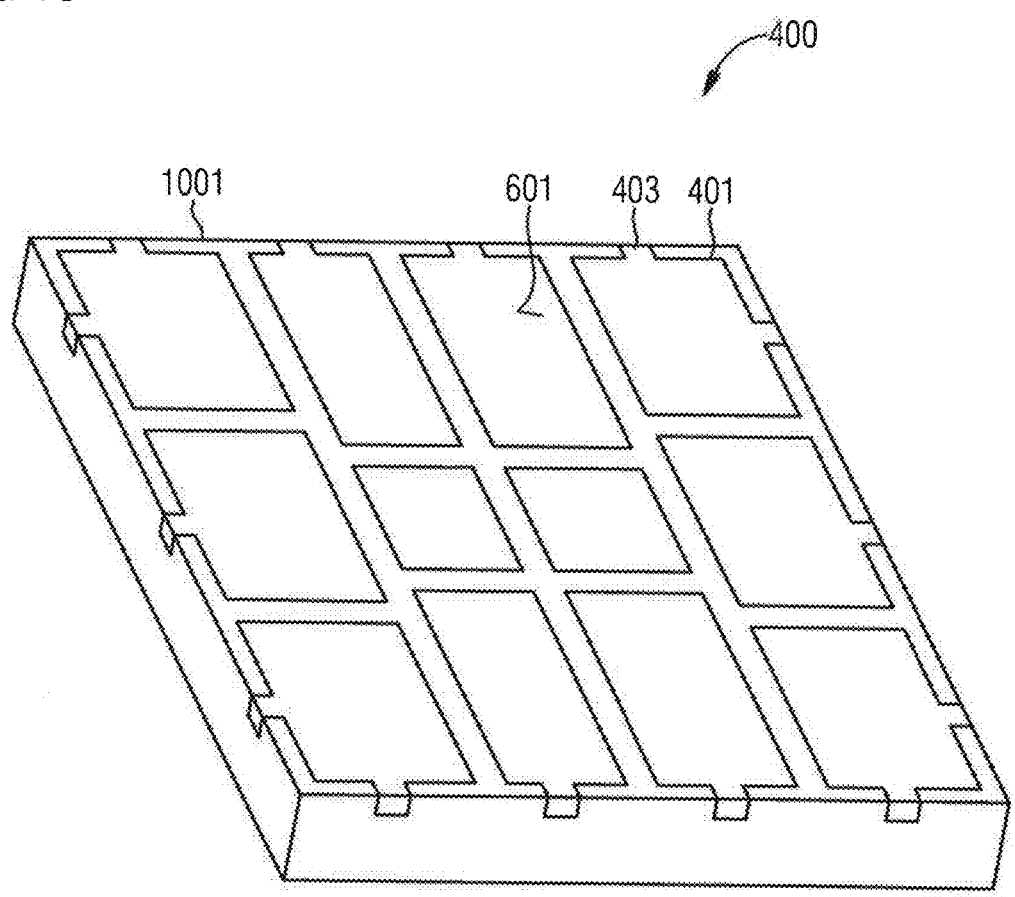
Figure 14:
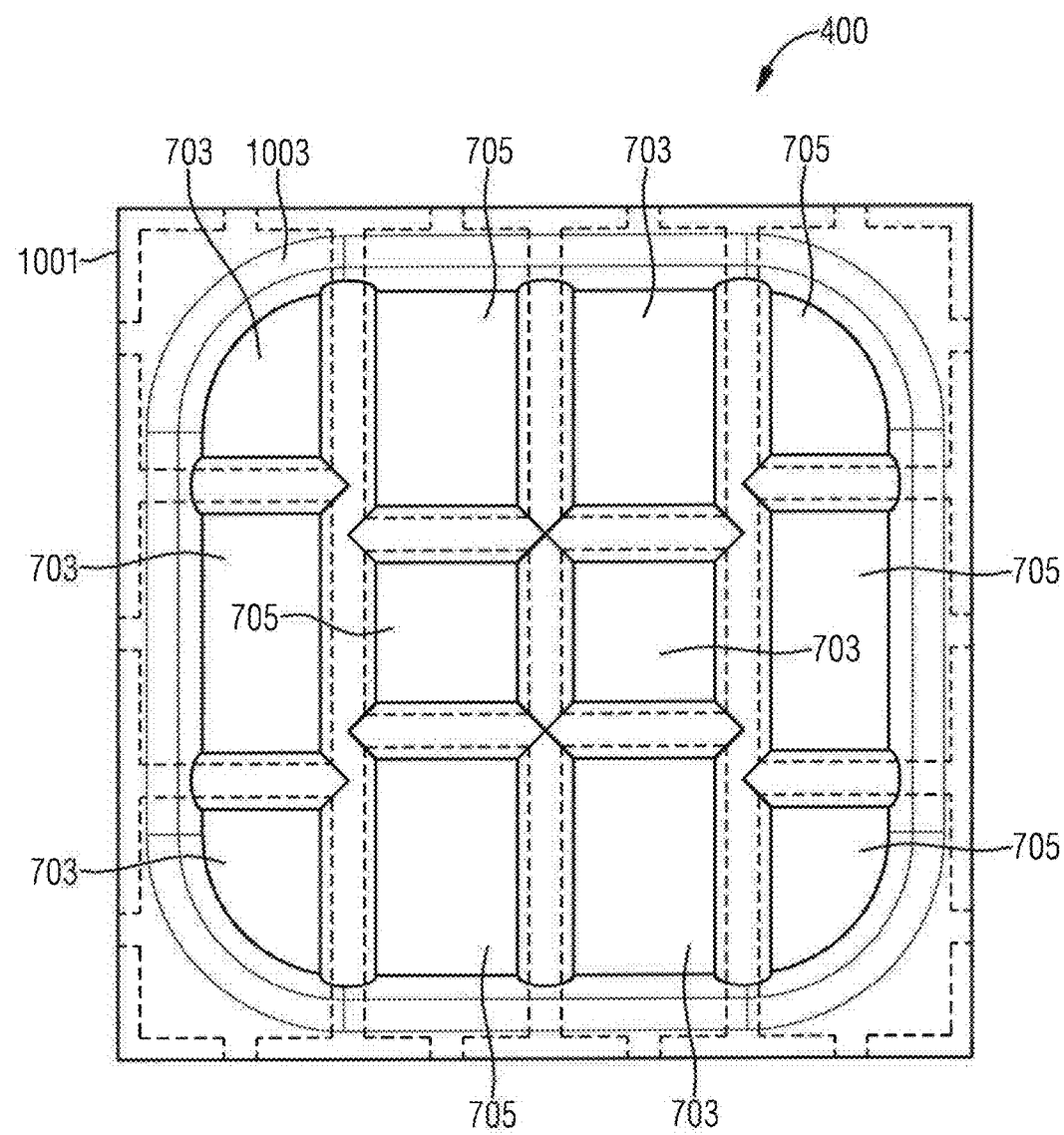
Figure 15:
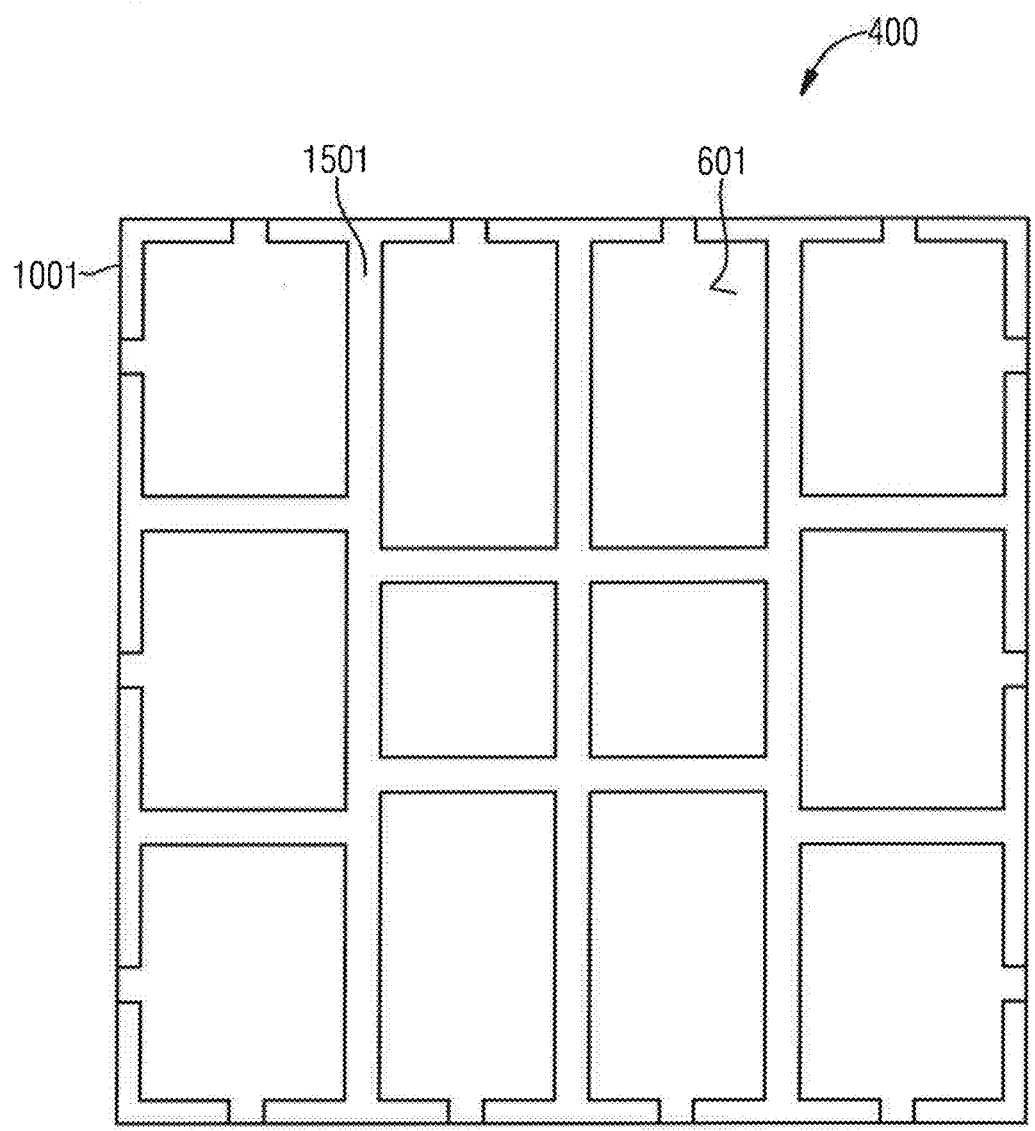

FIGS. 13 to 15 respectively show the lead frame 400 at a later time in the method of processing a lead frame, relative to the lead frame 400 shown in FIGS. 10 to 12. FIG. 13 shows a plan view obliquely from below of the lower side 601. FIG. 14 shows a plan view from above of the contact subsections 703, 705. FIG. 15 shows a plan view from below of the lower side 601.

Provision is made that the lead frame 400 is now structured from its lower side 601. In particular, provision is made here for the first and second contact subsections 703, 705 to be separated from one another, for example, by etching away the depression 701, i.e. etching away the bottom of the depression 701. In particular, during this structuring, provision is made for the stabilizing elements 407 to be removed. This is done, for example, by an etching process. Reference 1501 symbolically indicates the depression 701 which is now removed, and therefore no longer present.

The effect achieved because of this structuring (which the reference 1607 symbolically represents in FIG. 16) is that the first electrically conductive contact subsection 703 and the second electrically conductive contact subsection 705 are electrically insulated from one another. The contact subsections 703, 705 insulated from one another may therefore be used to contact an anode and a cathode of an optoelectronic semiconductor component.

FIGS. 16 to 22 respectively show an optoelectronic lighting device 1701 in different views.

Figure 17:
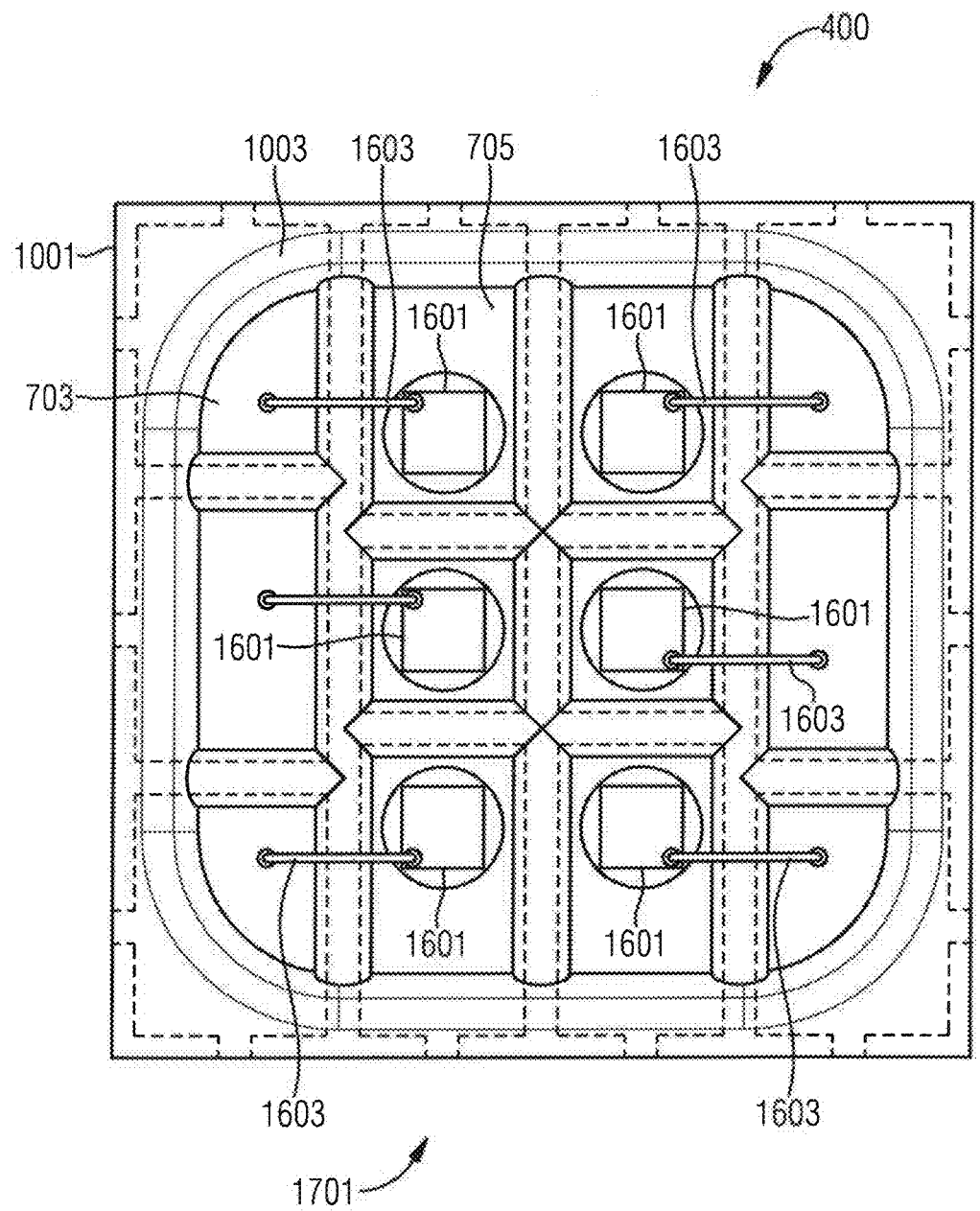
Figure 18:
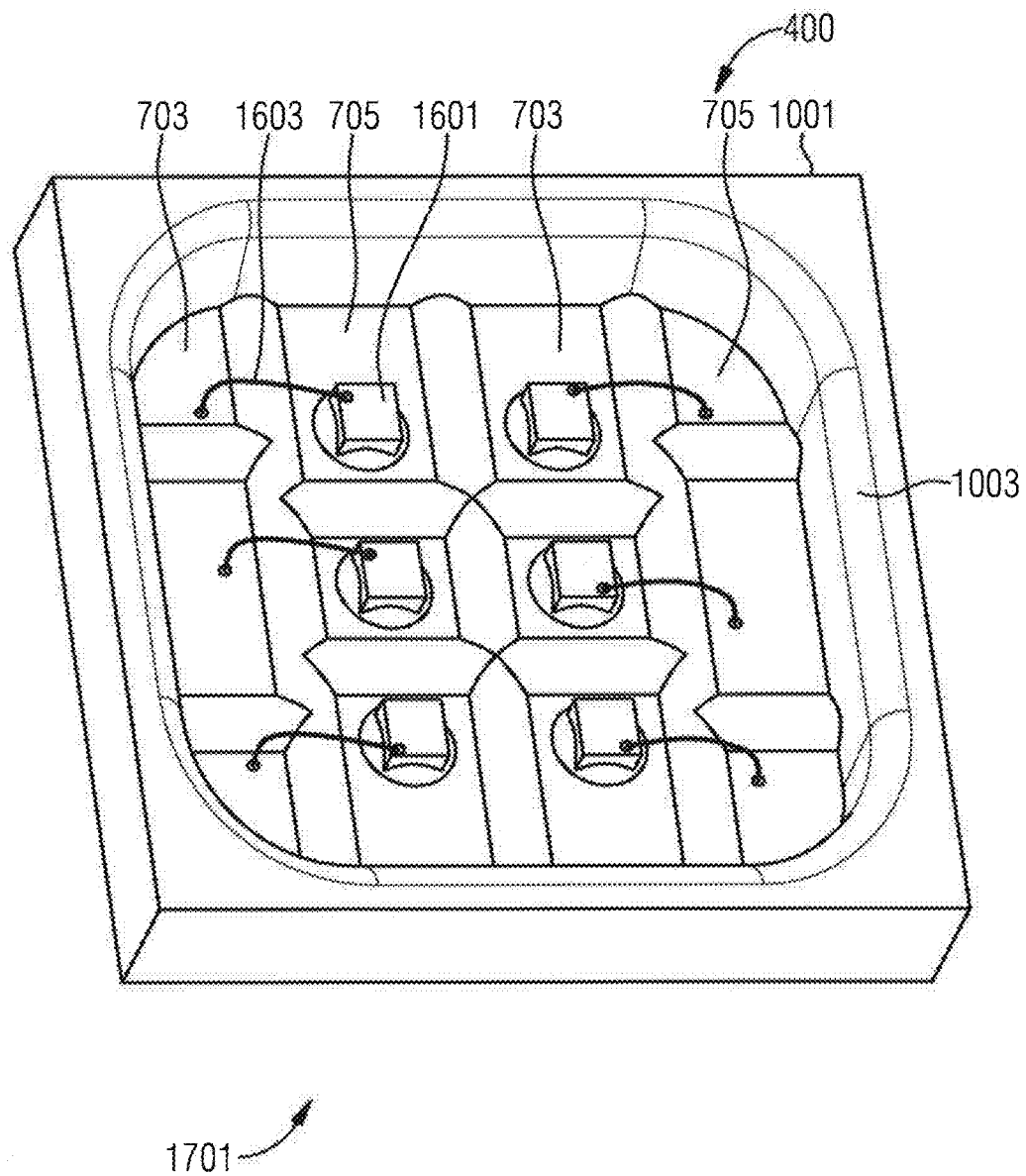
Figure 19:
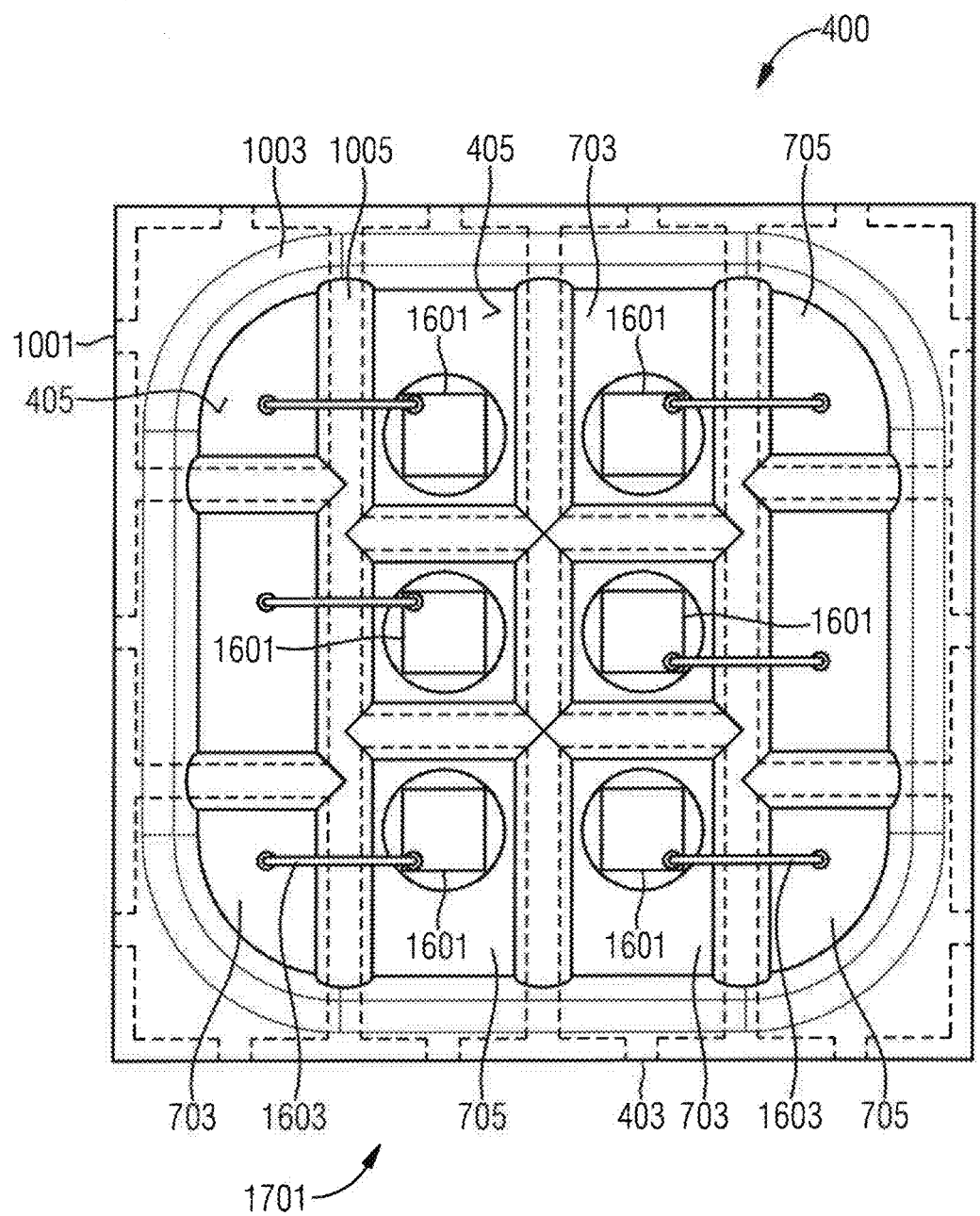
Figure 20:
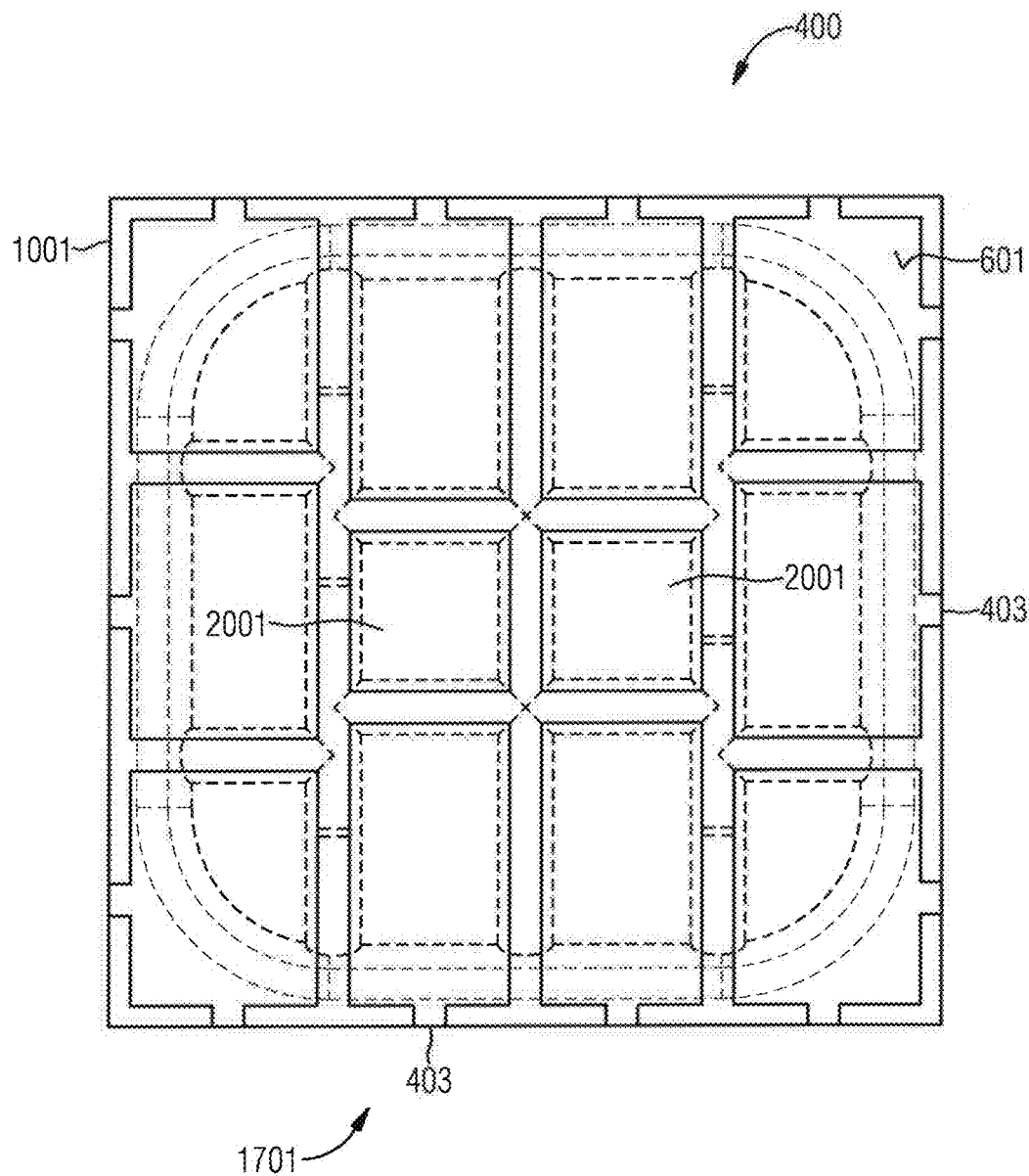
Figure 21:
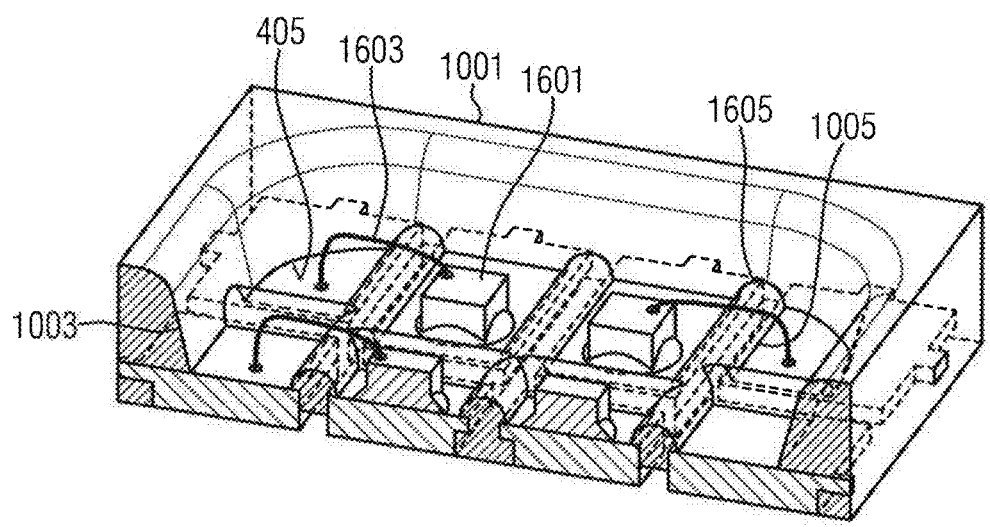
Figure 22:
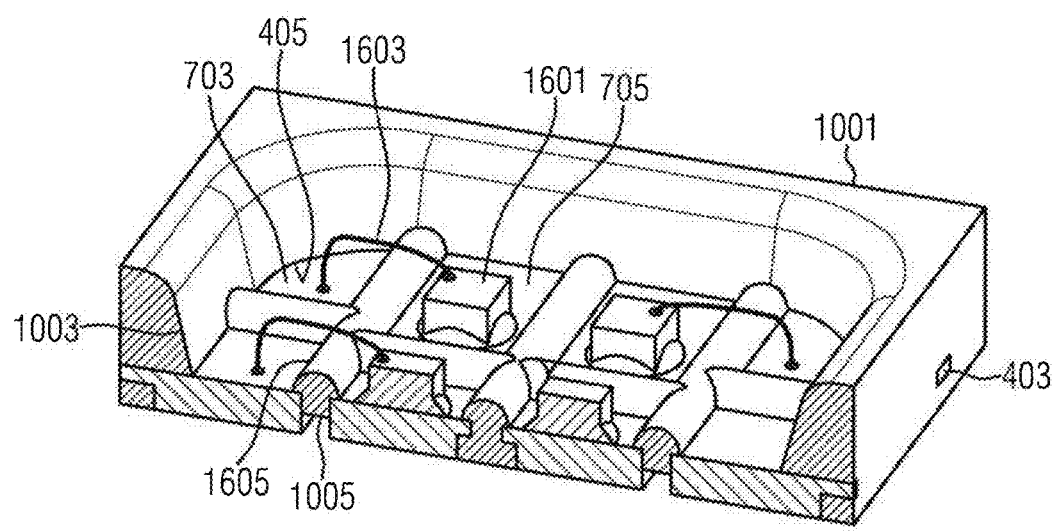

FIG. 16 shows a view obliquely from below of the optoelectronic lighting device 1701, the lighting device 1701 being represented in cut-away. FIG. 17 shows a plan view from above of the lighting device 1701. FIG. 18 shows a plan view obliquely from above of the lighting device 1701. FIG. 19 shows a plan view from above of the lighting device 1701. FIG. 20 shows a plan view from below of the lighting device 1701. FIGS. 21 and 22 respectively show a plan view obliquely from above of the lighting device 1701, the lighting device 1701 being represented in cut-away. In FIG. 21, the housing 1001 is represented transparently so that the individual encapsulated or embedded elements can be seen better. In FIG. 22, the housing 1001 is no longer represented transparently, which essentially corresponds to a real view.

The optoelectronic lighting device 1701 comprises the lead frame 400, processed according to FIGS. 13 to 15, comprising the housing 1001. An optoelectronic semiconductor component 1601 is respectively arranged on an upper side 405 of a first or second contact subsection 703, 705. In this case, three semiconductor components 1601 are respectively arranged on a second electrically conductive contact subsection 705. Three semiconductor components 1601 are respectively arranged on a first electrically conductive contact subsection. The lighting device 1701 therefore comprises six semiconductor components 1601. In examples not shown, provision may be made for more or fewer than six semiconductor components to be provided.

The optoelectronic semiconductor components 1601 have a light-emitting face (not represented in detail here), by which light can be emitted. This light-emitting face faces away from the upper side 405.

The respective contact subsection 703, 705, on which the semiconductor components 1601 are arranged, thus achieves electrical contacting of the corresponding semiconductor component 1601, for example, contacting the cathode or the anode of the respective semiconductor component 1601. Correspondingly, a further first or second electrically conductive contact subsection 703, 705 respectively achieves electrical contacting of the cathode or anode of the respective semiconductor component 1601. For this electrical contacting, an electrical connection between the first or second contact subsection 703, 705 is provided to that contact subsection 703, 705 on which the respective semiconductor component 1601 is arranged. This electrical contacting is, for example, formed by a bonding wire 1603.

In FIG. 20, two of the electrically conductive contact subsections 703, 705 are provided with the reference 2001. These contact subsections 2001 are cantilevered contact subsections. This thus means that they are not anchored in the housing frame 1003 by anchoring elements 403. These cantilevered contact subsections 2001 may, in particular, be produced by mechanical stabilization having been formed during the processing method between the first and second contact subsections 703, 705 by the housing frame section 1005. The housing frame section 1005 stabilizes the two contact subsections 2001 so that they themselves no longer need to be anchored in the housing frame 1003 by anchoring elements 403.

Figure 23:
FIGS. 23 and 24 respectively show an etching step.
Figure 23:
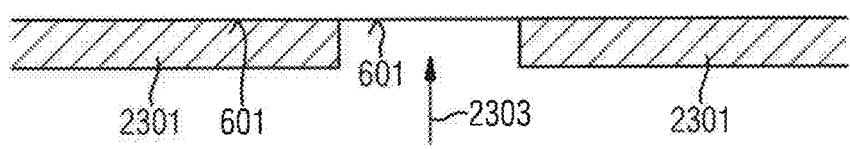
Figure 24:
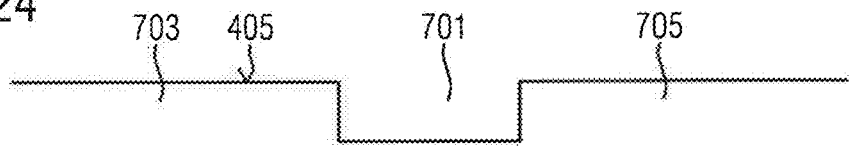
Figure 24:
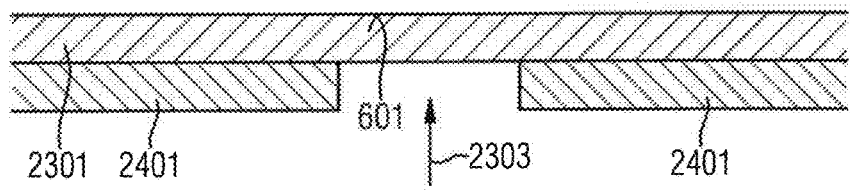

FIGS. 23 and 24 respectively show an etching step of the lower side 601 of the contact subsections 703, 705.

According to FIG. 23, for example, provision may be made for an etching protection layer 2301 to be applied onto the lower side 601, the region to be etched being exposed. An arrow with the reference 2303 indicates this exposed region, which is etched away in the scope of selective etching to separate the depression 701 to electrically insulate the contact subsections 703, 705 from one another.

The etching protection layer 2301 may, for example, be formed from NiPdAu or comprise NiPdAu.

According to FIG. 24 an etching process comprising two steps is represented symbolically. Provision is made for a photoresist 2401 to be applied onto the etching protection layer 2301, the etching protection layer 2301 being formed continuously here. Conversely, the photoresist 2401 is applied such that the region 2303 to be etched is exposed.

Figure 25:
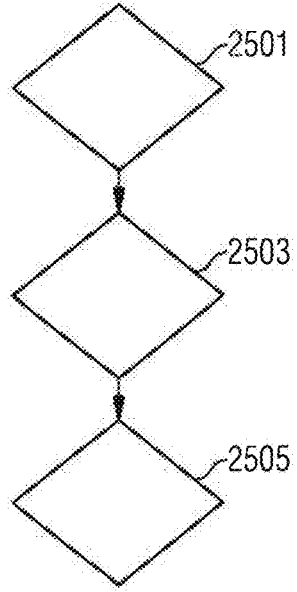
FIG. 25 shows a flow chart of a method of processing a lead frame.

FIG. 25 shows a flow chart of a method of processing a lead frame having at least one electrically conductive contact section, comprising the following steps:

forming 2501 a depression in the at least one electrically conductive contact section so that a first electrically conductive contact subsection and a second electrically conductive contact subsection are formed, which are delimited from one another by the depression, forming 2503 a housing made of a housing material, which housing comprises a housing frame that at least partially embeds the lead frame, formation of the housing comprising introduction of housing material into the depression so that a housing frame section formed by the housing material introduced into the depression is formed between the first and second electrically conductive contact subsections to mechanically stabilize the first and second electrical conductive contact subsections by the housing frame section.

According to a step 2505, provision is furthermore made for the first and second electrically conductive contact subsections to be separated from one another so that the first and second electrically conductive contact subsections are electrically insulated from one another.

We thus provide, in particular and inter alia, the idea of producing separate solder pads, i.e. first and second electrically conductive contact subsections, by two additional structuring steps only after formation of the housing, i.e. in particular after overmolding of the lead frame. In this way, cantilevered electrically conductive contact subsections, i.e. cantilevered solder pads, can advantageously be produced. Furthermore, additional stabilizing structures (stabilizing elements) can therefore be used before formation of the housing, for example, before the molding if these additional stabilizing structures can be removed again after formation of the housing, for example, by etching. In this way, more complex and more difficult lead frame structures can be made possible.

It is therefore advantageously possible to produce a 6-chip design with cantilevered solder pads. For example, a QFN lead frame design known per se (the lead frame comprising one or more electrically conductive contact sections) may be used as a starting point. "QFN" stands for Quad Flat No Leads package. In this starting design, some of the solder pads are still combined, which thus means that the electrically conductive contact section is not yet subdivided into a first and a second electrically conductive contact subsection. This thus means that the anode and the cathode of some of the solder pads are still short-circuited. In particular, additional stabilizing connectors, stabilizing elements, may also be incorporated. In particular, in addition or as an alternative, provision may be made for a plurality of anodes to be short-circuited to one another and/or for a plurality of cathodes to be short-circuited to one another. The first and second electrically conductive contact subsections respectively then form an anode or respectively form a cathode, which are still short-circuited before the separation of the first and second electrical contact subsections.

Then, in particular, an additional structuring step is provided (the step of forming a depression). This additional structuring step need not necessarily be carried out as a separate step, but according to one example may be integrated in a semietching step when the lead frame is being produced. By this additional structuring (depression), the future separate solder pads (first and second electrically conductive contact subsections) are defined and preparing for subsequent separation of these solder pads advantageously takes place. The depth to which a material is in this case ablated is, in particular, a balance between a required stabilization of the lead frame and the greatest possible amount of housing material, for example, molding compound or encapsulation compound or injection molding compound between the solder pads.

This is followed, in particular, by formation of the housing. This thus means that, in particular, it is followed by molding of the lead frame. The previously produced material recesses (depressions) are then likewise filled with a housing material, for example, with a molding compound or encapsulation compound or injection molding compound. Depending on how good adhesion is between the lead frame material and the housing material, for example, the molding compound, adhesive barriers (also referred to as bond barriers) may be formed which may, for example, have a mushroom shape or mushroom structure. This may, in particular, then be advantageous to maintain the separated solder pads in the assembly. Provision of an adhesive barrier has, in particular, the advantage that an applied adhesive is impeded from flowing onto neighboring solder pads by the adhesive barriers. The applied adhesive is stopped at the adhesive barriers. Furthermore, adhesive barriers advantageously increase a generally short path of the housing material through the solder pads. A risk of so-called "incomplete fill", i.e. partial filling, is reduced.

Formation of the housing, for example, the molding, stabilizes the lead frame assembly to such an extent that the additional struts (mechanical stabilizing elements) and the first and second contact subsections can then be separated from one another. This thus means that, by an additional structuring step, these stabilizing structures (stabilizing elements) are then removed and the individual solder pads (first and second contact subsections) are separated.

This additional structuring step, i.e. in particular formation of the depression and/or removal of the stabilizing structures and/or separation of the individual solder pads may, for example, comprise the following:

The structures may be formed both by photolithography and with structured bonding pad metallization (no plating, i.e. metal coating, at the positions at which etching is meant to be carried out) and selective chemistry. The structuring itself may, for example, be carried out by wet or dry chemical etching methods.

Wet chemical may, for example, comprise the following etching process: $H_2O+HCl+FeCl$. In this case, in particular, provision is made for contact of these chemical substances with a silicone, i.e. in particular with an encapsulation material, i.e. a housing material, to be avoided.

Dry chemical may, for example, comprise chlorine etching. For example, a chlorine etch may comprise the following: $N_2+CCl_4$ with $CF_4$ as an additive. This depends, in particular, on a required structure shape.

Depending on the chemistry used and the etching method used, provision may be made for CuCl emission or $CuCl_2$ emission to be used as a signal to stop the etching process.

To protect the front side 405, if necessary, according to one example a film or a coating material may be used.

It was mentioned above that the depressions were formed on the front side 405. In an example not shown, provision is made for the depressions to be formed on the rear side 601. In this case, provision is then made for the further structuring, i.e. the breaking or separation of the first and second electrically conductive contact subsections to be carried out from the upper side 405. The comments made in connection with formation of the depression from the front side or upper side 405 apply similarly for formation of the depression from the rear side or lower side 601.

Advantages are, in particular, that insulated, i.e. cantilevered, lead frame pads i.e. first and second electrically conductive contact subsections, can now be produced. In this way, greater design freedom is achieved for a lead frame design. Complex lead frame designs can therefore be produced. This is because the solder pads no longer each need to be anchored per se. In particular, it is possible to use lead frame stabilizing structures (mechanical stabilizing elements) which can be removed again straightforwardly later, i.e. after formation of the housing. In particular, integration of additional components is facilitated. In this way, for example, complex integrated circuits (ICs) can be produced.

In this way, miniaturization can thus be achieved. This thus means that the same functionality can be produced in a reduced space. This is expedient and advantageous particularly for multichip packages, i.e. in a plurality of optoelectronic semiconductor components.

In particular, a simplified solder pad design is thereby made possible. The solder pads can be positioned optimally. It is not necessary to take correct anchoring into consideration. In this way, solder pad sizes which are more customer-friendly and more reliable, since they are adapted, can be produced.

Although our methods and lead frames have been illustrated and described in detail by the preferred examples, this disclosure is not restricted by the examples disclosed and other variants may be derived therefrom by those skilled in the art without departing from the protective scope of the appended claims.

This application claims priority of DE 10 2015 107 515.6, the subject matter of which is incorporated herein by reference.

The invention claimed is:

1. A method of processing a lead frame having at least one electrically conductive contact section, comprising:
    forming a depression in the at least one electrically conductive contact section so that a first electrically conductive contact subsection and a second electrically conductive contact subsection are formed, which are delimited from one another by the depression, wherein the depression has a bottom via which an electrically conductive connection between the first electrically conductive contact subsection and the second electrically conductive contact subsection is established, and
    forming a housing made of a housing material, which housing comprises a housing frame that at least partially embeds the lead frame, formation of the housing comprising introduction of housing material into the depression so that a housing frame section formed by the housing material introduced into the depression is formed between the first and second electrically conductive contact subsections to mechanically stabilize the first and second electrical conductive contact subsections by the housing frame section.

2. The method according to claim 1, wherein formation of the housing frame section comprises formation of an adhesive barrier section arranged outside the depression so that the housing frame section comprises an adhesive barrier section arranged outside the depression.

3. The method according to claim 1, wherein, in a plurality of electrically conductive contact sections, they are at least partially connected by at least one mechanical stabilizing element, which is at least partially embedded in the housing frame during formation of the housing.

4. The method according to claim 3, wherein the at least one mechanical stabilizing element is removed after formation of the housing.

5. The method according to claim 3, wherein the at least one mechanical stabilizing element is removed after formation of the housing, and removal comprises etching.

6. The method according to claim 3, wherein the at least one mechanical stabilizing element is removed after formation of the housing, the removal comprises etching, and a region intended to remain free from etching is provided with etching protection.

7. The method according to claim 3, wherein the at least one mechanical stabilizing element is removed after formation of the housing, the removal comprises etching, and etching comprises dry etching and/or wet etching.

8. The method according to claim 3, wherein the at least one mechanical stabilizing element is removed after formation of the housing, the removal comprises etching, the etching comprises dry etching and/or wet etching, and the dry etching comprises chlorine etching and/or the wet etching comprises etching by HCl and FeCl.

9. The method according to claim 3, wherein the at least one mechanical stabilizing element is removed after formation of the housing, the removal comprises etching, and the electrically conductive contact section is partially coated with a metal before the formation of the housing to form a metal coating, a region to be etched remaining free from the metal layer coating.

10. The method according to claim 1, comprising separation of the first and second electrically conductive contact subsections from one another so that the first and second electrically conductive contact subsections are electrically insulated from one another.

11. The method according to claim 10, wherein separation comprises etching.

12. The method according to claim 1, wherein formation of the depression comprises etching.

13. A lead frame, comprising:
at least one electrically conductive contact section,
wherein a depression is formed in the at least one electrically conductive contact section,
so that a first electrically conductive contact subsection and a second electrically conductive contact subsection are formed, which are delimited from one another by the depression,
the lead frame is at least partially embedded in a housing frame of a housing made of a housing material,
the housing frame comprises a housing frame section formed by a housing material between the first and second electrically conductive contact subsections introduced into the depression to mechanically stabilize the first and second electrical conductive contact subsections by the housing frame section, and
the first and second electrically conductive contact subsections are separated from one another so that the first and second electrically conductive contact subsections are electrically insulated from one another due to a removal of the depression.

14. The lead frame according to claim 13, wherein the housing frame section comprises an adhesive barrier section arranged outside the depression.

15. The lead frame according to claim 13, wherein a plurality of first and second electrically conductive contact subsections are formed, a plurality of the first and/or second electrically conductive contact subsections respectively having an anchoring element, others of the first and/or second electrically conductive contact subsections being free from an anchoring element.

16. An optoelectronic lighting device, comprising an optoelectronic semiconductor component and the lead frame according to claim 13, wherein the semiconductor component is arranged on one of the first and second electrically conductive contact subsections, an electrically conductive connection being formed between the optoelectronic semiconductor component and the other of the first and second electrically conductive contact subsections.

* * * * *